(12) United States Patent
Biswas et al.

(10) Patent No.: US 11,983,474 B1
(45) Date of Patent: May 14, 2024

(54) CONNECTING RANDOM VARIABLES TO COVERAGE TARGETS USING AN ENSEMBLE OF STATIC ANALYSIS, DYNAMIC ANALYSIS AND MACHINE LEARNING AND GUIDED CONSTRAINT SOLVING OF THE RANDOM VARIABLES DURING SIMULATION OF AN INTEGRATED CIRCUIT

(71) Applicant: Synopsys, Inc., Mountain View, CA (US)

(72) Inventors: Parijat Biswas, Benniganahalli (IN); Badri Gopalan, Cupertino, CA (US); Enzhi Ni, Shanghai (CN); Danish Jawed, Indirapuram (IN); Ying Chen, Shanghai (CN); Jiang Chen, Shanghai (CN)

(73) Assignee: Synopsys, Inc., Sunnyvale, CA (US)

( * ) Notice: Subject to any disclaimer, the term of this patent is extended or adjusted under 35 U.S.C. 154(b) by 252 days.

(21) Appl. No.: 17/561,371

(22) Filed: Dec. 23, 2021

Related U.S. Application Data

(60) Provisional application No. 63/138,025, filed on Jan. 15, 2021, provisional application No. 63/129,940, filed on Dec. 23, 2020.

(51) Int. Cl.
*G06F 30/30* (2020.01)
*G01R 31/3183* (2006.01)
(Continued)

(52) U.S. Cl.
CPC ... *G06F 30/3308* (2020.01); *G01R 31/31835* (2013.01); *G01R 31/318357* (2013.01); *G06F 30/323* (2020.01)

(58) Field of Classification Search
None
See application file for complete search history.

(56) References Cited

U.S. PATENT DOCUMENTS

| | | | | |
|---|---|---|---|---|
| 7,617,468 B2 * | 11/2009 | Thakur | ................. | G06F 30/398 716/106 |
| 8,510,692 B2 * | 8/2013 | Fister | .................... | G06F 30/327 716/106 |

(Continued)

OTHER PUBLICATIONS

C. Ioannides et al., "Coverage-Directed Test Generation Automated by Machine Learning—A Review," ACM Transactions on Design Automation of Electronic Systems, vol. 17, No. 1, Article 7, Jan. 2012, pp. 1-21. (Year: 2012).*

(Continued)

*Primary Examiner* — Leigh M Garbowski
(74) *Attorney, Agent, or Firm* — Andrew L. Dunlap; Haynes Beffel & Wolfeld LLP

(57) ABSTRACT

A method for verifying an integrated circuit (IC) design described in a hardware description or hardware verification language (HDHVL) is provided. The method includes identifying connections between random variables and coverage areas of the IC design, as described in HDHVL code, the connections being identified by determining which coverage areas of the IC design will be influenced during simulation by which random variables. The method can further include storing the identified connections in a database, and using, by a processor, connections retrieved from the database to simulate and verify the coverage areas of the IC design.

20 Claims, 20 Drawing Sheets

100

(51) Int. Cl.
    *G06F 30/323*     (2020.01)
    *G06F 30/3308*     (2020.01)

(56) References Cited

U.S. PATENT DOCUMENTS

| | | | |
|---|---|---|---|
| 8,904,321 B1 * | 12/2014 | Cohen | G06F 30/20 |
| | | | 716/112 |
| 9,373,077 B1 * | 6/2016 | Cohen | G06F 30/33 |
| 11,055,458 B1 * | 7/2021 | Suresh | G06F 30/3308 |

OTHER PUBLICATIONS

Jomu George M.P., et al., "A Methodology To Generate Evenly Distributed Input Stimuli By Clustering Of Variable Domain," 2015 33rd IEEE Int'l Conference on Computer Design (ICCD), pp. 605-612. (Year: 2015).*

* cited by examiner

400

```
class data;
  rand reg [31:0] addr1;
  rand reg [31:0] addr2;
  covergroup covg;
    CP1: coverpoint addr1 {
      bins BIN1[] = {[0:N]} ;
    }
  endgroup
endclass
```

Random Variables

Coverage Group

Connection of coverage point "CP1" to random variable "rand reg [31:0] addr1"

```
covergroup covg with function sample(reg [31:0] addr1);
    CP1: coverpoint 'addr1' {
        bins BIN1[] = {[4:5]};
    }
endgroup
covg cg_inst=new;
class data_bus;
rand reg [31:0] addr1;

function void post_randomize();
    cg_inst.sample(addr1);
endfunction
endclass
```

- Coverage Group → `covergroup covg`
- Random Variable → `reg [31:0] addr1`
- Connection of coverage point "CP1" to random variable "addr1"
- Instantiation of addr1

FIG. 4B

```
class data_bus;                                          ← Random
    rand reg [31:0] addr1;                                 Variables
endclass
class data_mem;                                          ←
    rand reg [31:0] mem1;
endclass
class cov_class                 ← Coverage Group
    covergroup covg(data_bus b, data_mem m)    ← Connection 1 of coverage point "CP1" to
        CP1: coverpoint b.addr1 {                     random variable "rand reg [31:0] addr1"
            bins BIN1[] = {[0:1]} ;
        }
        CP2: coverpoint m.mem1 {                   ← Connection 2 of coverage point "CP2" to
            bins BIN1[] = {[0:1]} ;                       random variable "rand reg [31:0] mem1"
        }
    ...
    endgroup
endclass
```

```
"covergroups": [
  {
    "name": "MyProgram::Packet::cg",   ⎫ Names and
    "file": "test.sv",                  ⎬ Locations of
    "line": 20,                         ⎭ Coverage Groups
    "coverpoints": [
      {
        "name": "cf",                   ⎫
        "line": 22,                     ⎬ Names and
        "expr": "MyProgram::Packet::addr", ⎬ Locations of
        "expr_width": 8,                ⎬ Coverage Points
        "is_compile_connected": 1,      ⎭
        "randvars": [
          {
            "name": "addr",             ⎫ Names and
            "file": "test.sv",          ⎬ Locations of
            "line": 3                   ⎬ Connected
          }                             ⎬ Random
        ]                               ⎭ Variables
      }
    ],
    "crosspoints": [
      {
        "name": "crf",                  ⎫
        "line": 33,                     ⎬ Names and
        "connected sample CPs": [       ⎬ Locations of
          "cf",                         ⎬ Connected Cross
          "cf"                          ⎬ Points
        ],                              ⎭
        "un-connected sample CPs": []
      }
    ]
  }
]
```

FIG. 5

```
"Coverage Summary Report": {                ⎫
  "Total CoverGroups":                      ⎬
  "Sample Summary report": [                ⎬
    "coverage point info ": [               ⎬
      "cp count": 2,                        ⎬ Sample
      "static_connection": 2,               ⎬ Summary
      "conndb connection": 0,               ⎬ Report
      "connection %": 100                   ⎬
    ],                                      ⎬
    "coverage bin info ": [                 ⎬
      "bin count": 19,                      ⎬
      "static_connection": 19,              ⎬
      "conndb connection": 0,               ⎬
      "connection %": 100                   ⎭
    ]
  },
  "Cross Summary report": [                 ⎫
    "coverage point info ": [               ⎬
      "cr count": 1,                        ⎬
      "connected cps": 1,                   ⎬ Cross
      "connection %": 100                   ⎬ Summary
    ],                                      ⎬ Report
    "coverage bin info ": [                 ⎬
      "bin count": 48,                      ⎬
      "connected bins": 48,                 ⎬
      "connection %": 100                   ⎭
    ]
  ]
}
```

500

600 Example Simulation Runtime Connectivity Code Regarding Dynamic Connections

```
$mapcpwithclassmember( uart_agent_pkg.uart_agent_cov.uart_cg ,
cp_en_parity , uart_fifo_
full_vseq, uart_fifo_full_vseq, en_parity )
$mapcpwithclassmember( uart_agent_pkg.uart_agent_cov.uart_cg ,
cp_en_parity , uart_sanity_vseq, uart_sanity_vseq, en_parity )
```

FIG. 6A

602 Connectivity Information from Dynamic Connections

| Coverage Group | Random Variable | Coverage Point |
|---|---|---|
| Uart_agent_pkg.uart_agent_cov.uart_cg | en_parity | cp_en_parity |

FIG. 6B

700 Machined Learned Connections

| Bin Name | Model Predictions | Expression | Inferred expression ranges |
|---|---|---|---|
| INCR16_BURST | Data_[4] | test.ahbF1Coverage.coverageData.burst_type | this.data_[4] dist {[0:4275682944] := 96, [946986720:4275682944] := 4, [0:946986720] := 1, [10161274224:4275682944] := 1 }; |

FIG. 7

800 User Connection Hints

| Name | SV Reference | Type | Connected Random Variable | Connectivity Information |
|---|---|---|---|---|
| C1 | Cg1.s1 | Sample | Class1.var1[5:0] | sv_function_name($1) |
| C2 | Cg1.s2 | Sample | class1.var1[3:0], class1.var2[1:0] | {$1, $2} //concat |
| C3 | Cg1.s3 | Sample | Class2.var1, class1.var2 | $1 + $2 //addition |
| C4 | Cg1.c1 | Cross | C1, C2, C3 | |

```
class sender;
    rand UNIT_TYPE unit_type;
    rand int id;
    constraint cb_sender {...} endclass class receiver;
    rand UNIT_TYPE unit_type;
    rand int id;
    constraint cb_receiver {...} endclass class instruction;
    rand OP_TYPE op_type;
    rand int operand_num;
    rand int cycles;
    constraint cb_instr {...} endclass class instruction_generator;
    rand sender s;
    rand receiver r;
    rand instruction instr;
    constraint cb_generator {...} endclass class instruction_coverage;
    instruction_generator ig;

covergroup cg_sender;
        cp1: coverpoint ig.s.unit_type;

cp2: coverpoint ig.s.id;
        cr: cross cp1, cp2;
    endgroup covergroup cg_receiver;
        cp1: coverpoint ig.r.unit_type;

cp2: coverpoint ig.r.id;
        cr: cross cp1, cp2;
    endgroup
``` instrumented covergroup:
    coverpoint: id = 4, var = unit_type
    coverpoint: id = 5, var = id
    cross:      id = 6, var_list = [unit_type, id]

instrumented covergroup:
    coverpoint: id = 4, var = unit_type
    coverpoint: id = 5, var = id
    cross:      id = 6, var_list = [unit_type, id]

instrumented covergroup:
    coverpoint: id = 7, var = op_type
    coverpoint: id = 8, var = operand_num
    coverpoint: id = 9, var = cycles
    cross:      id = 10, var_list =
                [op_type,   operand_num,
    cycles]

instrumented covergroup:
    cross:      id = 11, var_list =
                [s.unit_type, r.unit_type,
    instr.op_type]

instrumented id: 1
instrumented callback function to get handle of ig.s

2......
3......

instrumented id: 4
instrumented callback function to get handle of ig.r

```
covergroup cg_instr;
    cp1: coverpoint ig.instr.op_type;
    cp2: coverpoint ig.instr.operand_num;
    cp3: coverpoint ig.instr.cycles;
    cr: cross cp1, cp2, cp3;
endgroup covergroup cg_type;
    cr: cross cg_sender.cp1, cg_receiver.cp1, cg_instr.cp1;
endgroup
...
endclass program main;
    instruction_generator ig = new;
    instruction_coverage ic = new;
    initial begin
        ic.ig = ig;
        repeat (1000) begin
            ig.randomize();
            ic.cg_sender.sample();
            ic.cg_receiver.sample();
            ic.cg_instr.sample();
            ic.cg_type.sample();
            ...
        end
    end
endprogram
``` instrumented id: 7
instrumented callback function to get handle of ig.instr

8......
9......
10......

instrumented id: 11
instrumented callback function to get handle of ig

```
class cls;
  rand bit[9:0] x, y;
constraint cb { x != y; } covergroup cg;
  cp1: coverpoint x {
        bins b0 = {[0:9]};
        bins b1 = {[10:99]};
        bins b2 = {[100:109]};
        bins b3 = {[110:199]};
        bins b4 = {[200:209]};
        bins b5 = {[210:299]};
        ...
        bins b18 = {[900:909]};
        bins b19 = {[910:999]};
        bins b20 = {[1000:1023]};
  }
  cp2: coverpoint y {
        bins b0 = {[0:9]};
        bins b1 = {[10:99]};
        bins b2 = {[100:109]};
        bins b3 = {[110:199]};
        bins b4 = {[200:209]};
        bins b5 = {[210:299]};
        ...
        bins b18 = {[900:909]};
        bins b19 = {[910:999]};
        bins b20 = {[1000:1023]};
  }
  cr1: cross cp1, cp2;
  endgroup
function new;
  cg = new;
endfunction
endclass : cls program main;
cls obj=new;
initial begin
  repeat (20) begin
    obj.randomize();
    obj.cg.sample();
  end
end
endprogram : main
```

FIG. 13

CONNECTING RANDOM VARIABLES TO COVERAGE TARGETS USING AN ENSEMBLE OF STATIC ANALYSIS, DYNAMIC ANALYSIS AND MACHINE LEARNING AND GUIDED CONSTRAINT SOLVING OF THE RANDOM VARIABLES DURING SIMULATION OF AN INTEGRATED CIRCUIT

RELATED APPLICATIONS

This application claims priority under 35 U.S.C. § 119(e) to (i) U.S. Provisional Application No. 63/129,940, entitled "CONNECTING SYSTEM VERILOG RANDOM VARIABLES TO COVERAGE EVENTS USING STATIC ANALYSIS, DYNAMIC ANALYSIS AND MACHINE LEARNING", filed on Dec. 23, 2020 and (ii) U.S. Provisional Application No. 63/138,025, entitled "IMPROVING FUNCTIONAL COVERAGE BY COVERAGE DIRECTED CONSTRAINT SOLVING", filed on Jan. 15, 2021.

TECHNICAL FIELD

The present disclosure relates to system verification of integrated circuit designs.

BACKGROUND

Integrated circuit (IC) design can be verified using a hardware description language (HDL) and a hardware verification language (HVL), such as SystemVerilog. Specifically, code generated from compiling HDL/HVL can be compiled used for runtime simulations to verify the performance of an IC. The HDL/HVL code can identify random variables that represent input values to which values can be assigned to for verifying the IC during simulation and can identify coverage areas that represent various points of observation of components of the IC.

One aspect of the verification of the IC design is functional coverage, which verifies various functions of various aspects of the IC. Functional coverage can be accomplished using constrained test generation, which is the generation of "test" inputs during simulation to test and verify the various functions of the IC by observing outputs or values of the coverage areas.

SUMMARY

In an embodiment a method for verifying an integrated circuit (IC) design described in a hardware description or hardware verification language (HDHVL) is provided. The method can include identifying connections between random variables and coverage areas of the IC design, as described in HDHVL code, the connections being identified by determining which coverage areas of the IC design will be influenced during simulation by which random variables. The method can further include storing the identified connections in a database, and using, by a processor, connections retrieved from the database to simulate and verify the coverage areas of the IC design.

In another embodiment, the identifying of the connections can include performing a static analysis of the HDHVL code at compile time, prior to runtime simulation, to identify static connections between at least a portion of the random variables and at least a portion of the coverage areas of the IC design.

In a further embodiment, the identifying of the connections can include performing a dynamic analysis of the HDHVL code at runtime simulation to identify dynamic connections between at least a portion of the random variables and at least a portion of the coverage areas of the IC design using symbolic simulation.

In an embodiment, the identifying of the connections can include performing machine learning to identify connections between at least a portion of the random variables and at least a portion of coverage areas of the IC design.

In another embodiment, the identifying of the connections can include receiving user guidance via a user interface or data provided by the user identifying connections between at least a portion of the random variables and at least a portion of the coverage areas of the IC design.

In an embodiment, the identifying of the connections can include at least two of: performing a static analysis of the HDHVL code at compile time, prior to runtime simulation, to identify static connections between at least a portion of the random variables and at least a portion of the coverage areas of the IC design; performing a dynamic analysis of the HDHVL code at runtime simulation to identify dynamic connections between at least a portion of the random variables and at least a portion of the coverage areas of the IC design using symbolic simulation; performing machine learning to identify connections between at least a portion of the random variables and at least a portion of coverage areas of the IC design; and receiving user guidance via a user interface or data provided by the user identifying connections between at least a portion of the random variables and at least a portion of the coverage areas of the IC design.

In a further embodiment, the identifying of the connections can include at least three of: performing a static analysis of the HDHVL code at compile time, prior to runtime simulation, to identify static connections between at least a portion of the random variables and at least a portion of the coverage areas of the IC design; performing a dynamic analysis of the HDHVL code at runtime simulation to identify dynamic connections between at least a portion of the random variables and at least a portion of the coverage areas of the IC design using symbolic simulation; performing machine learning to identify connections between at least a portion of the random variables and at least a portion of coverage areas of the IC design; and receiving user guidance via a user interface or data provided by the user identifying connections between at least a portion of the random variables and at least a portion of the coverage areas of the IC design.

In an embodiment, the identifying of the connections includes each of: performing a static analysis of the HDHVL code at compile time, prior to runtime simulation, to identify static connections between at least a portion of the random variables and at least a portion of the coverage areas of the IC design; performing a dynamic analysis of the HDHVL code at runtime simulation to identify dynamic connections between at least a portion of the random variables and at least a portion of the coverage areas of the IC design using symbolic simulation; performing machine learning to identify connections between at least a portion of the random variables and at least a portion of coverage areas of the IC design; and receiving user guidance via a user interface or data provided by the user identifying connections between at least a portion of the random variables and at least a portion of the coverage areas of the IC design.

In another embodiment, the coverage areas can include cross points and the identifying of connections can identify connections between at least a portion of the random variables and the cross points.

In an embodiment, the coverage areas can include coverage points and the identifying of connections can identify connections between at least a portion of the random variables and the coverage points.

In a further embodiment, the method can include obtaining coverage information regarding the coverage points for which the connections to the random variables have been identified, each coverage point of the coverage points including a plurality of bins, the coverage information including a status of the plurality of bins corresponding to each coverage point, wherein the simulating and verifying of the IC design can include, for a particular coverage point identified as being connected to a random variable, selecting a bin of the plurality of bins of the particular coverage point in dependence on the status of the plurality of bins of each coverage point, and simulating the IC design to continue closure of the particular coverage point by performing constrained randomization of the random variable connected to the selected bin of the particular coverage point.

In an embodiment, the status can indicate a number of times each bin of the plurality of bins has been hit to achieve a desired value of a corresponding coverage point.

In another embodiment, the selecting can select the bin in dependence on the status of the plurality of bins of each coverage point, such that the selected bin is hit to achieve a desired value less than a determined number of times.

In an embodiment, the simulating and verifying of the IC design can include loading a coverage database comprising coverage history data from previous simulations, wherein the closure of the particular coverage point can be continued in dependence on the coverage history data from the loaded coverage database.

In a further embodiment, the constrained randomization of the random variable connected to the selected bin of the particular coverage point is performed in dependence on the coverage history data from the loaded coverage database.

In an embodiment, a method for verifying an integrated circuit (IC) design described in a hardware description or hardware verification language (HDHVL) is provided. The method can include using identified connections between random variables and coverage points of the IC design, as retrieved from a database, to simulate and verify the coverage points of the IC design, and obtaining, by a processor, coverage information regarding the coverage points for which the connections to the random variables have been identified, each coverage point of the coverage points including a plurality of bins, the coverage information including a status of the plurality of bins corresponding to each coverage point, wherein the simulating and verifying of the coverage points of the IC design can include, for a particular coverage point identified as being connected to a random variable, selecting a bin of the plurality of bins of the particular coverage point in dependence on the status of the plurality of bins of each coverage point, and simulating the IC design to continue closure of the particular coverage point by performing constrained randomization of the random variable connected to the selected bin of the particular coverage point.

In another embodiment, the status can indicate a number of times each bin of the plurality of bins has been hit to achieve a desired value of a corresponding coverage point.

In an embodiment, the selecting can select the bin in dependence on the status of the plurality of bins of each coverage point, such that the selected bin is hit to achieve a desired value less than a determined number of times.

In a further embodiment, the simulating and verifying of the IC design can include loading a coverage database comprising coverage history data from previous simulations, wherein the closure of the particular coverage point can be continued in dependence on the coverage history data from the loaded coverage database.

In an embodiment, a system can be provided. The system can include a memory storing instructions for verifying an integrated circuit (IC) design described in a hardware description or hardware verification language (HDHVL), and a processor, coupled with the memory and configured to execute the instructions. The instructions when executed can cause the processor to perform operations including identifying connections between random variables and coverage areas of the IC design, as described in HDHVL code, the connections being identified by determining which coverage areas of the IC design will be influenced during simulation by which random variables. The operations can further include storing the identified connections in a database, and using connections retrieved from the database to simulate and verify the coverage areas of the IC design.

In other embodiments, systems can be provided to perform all of the above-described functionality. In further embodiments, a non-transitory computer readable recording medium having computer instructions recorded thereon can be provide, wherein the computer instructions, when executed, can provide all of the above-described functionality.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 4A illustrates an example of simplified SystemVerilog code that is analyzed at compile tile to identify connections between random variables and coverage points in accordance with some embodiments.

FIG. 4B illustrates another example of simplified SystemVerilog code that is analyzed at compile time to identify connections between random variables and coverage points in accordance with some embodiments.

FIG. 4C illustrates another example of simplified SystemVerilog code that is analyzed at compile time to identify connections between random variables and coverage points in accordance with some embodiments.

FIG. 5 illustrates an example connectivity report from static analysis in accordance with some embodiments.

FIG. 6A illustrates example simulation runtime connectivity code regarding dynamic connections in accordance with some embodiments.

FIG. 6B illustrates example results of dynamic analysis in accordance with some embodiments.

FIG. 7 illustrates example results from machine learning in accordance with some embodiments.

FIG. 8 illustrates example information for user guidance in accordance with some embodiments.

FIG. 10A illustrates generated compile-time instrumentation code in accordance with some embodiments.

FIG. 10B illustrate generated compile-time instrumentation code in accordance with some embodiments.

FIG. 13 illustrates pseudo-code of hardware description language (HDL) test in accordance with some embodiments.

DETAILED DESCRIPTION

Figure 1:
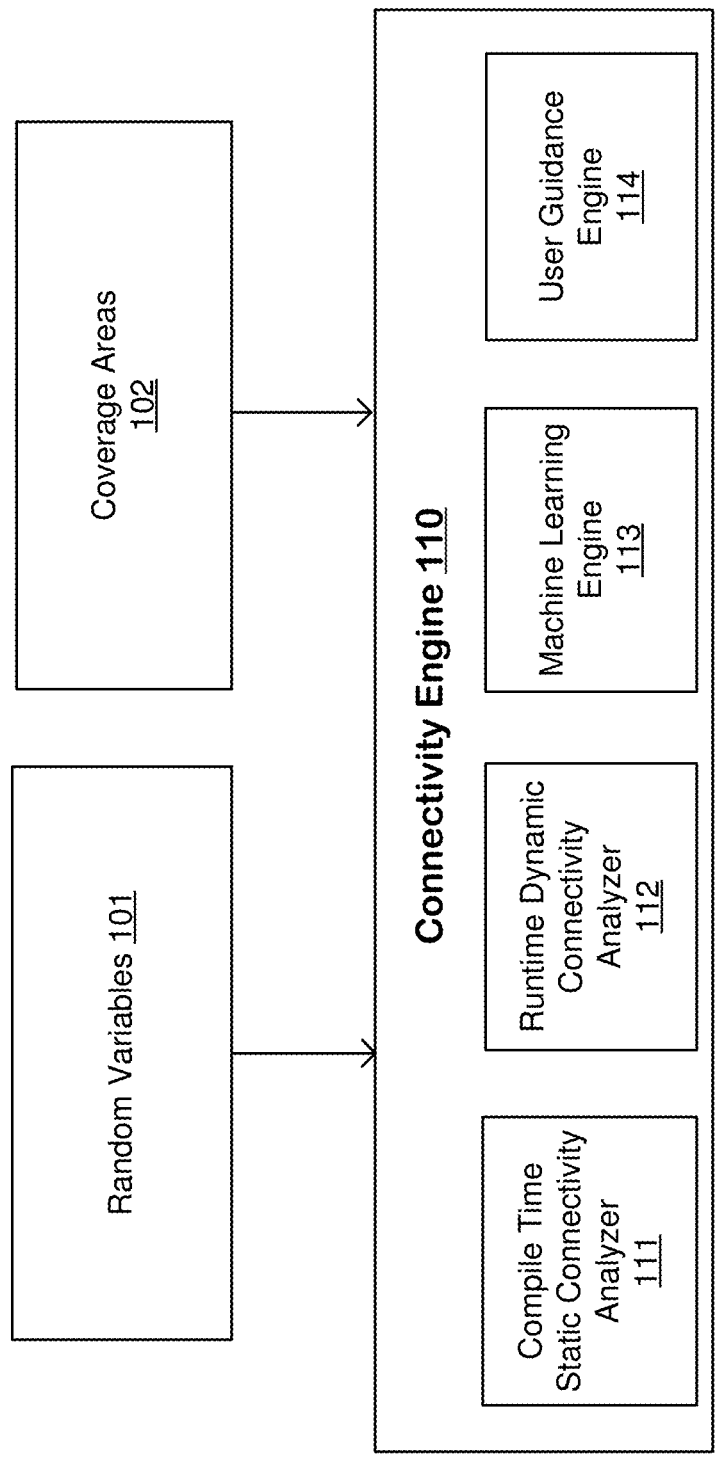
FIG. 1 illustrates an example block diagram of a connectivity engine in accordance with some embodiments.

Aspects of the present disclosure relate to connecting random variables to coverage targets (areas) using an ensemble of static analysis, dynamic analysis and machine learning and guided constraint solving of the random variables during simulation of an integrated circuit.

Random variables of hardware description and hardware verification language (HDL/HVL) code can be connected to coverage areas of integrated circuit (IC) using an ensemble of static analysis, dynamic analysis and machine learning techniques and constraining values of the random variables during simulation of an integrated circuit.

IC design can be verified using HDL and HVL code (e.g., SystemVerilog code).

Specifically, HDL/HVL code can be compiled and used for runtime simulations to verify the performance of an IC. The HDL/HVL code can include random variables that represent input values for verifying the IC during simulation and can include coverage areas that represent various components of the IC that are influenced by the values of the random variables. Some systems for verifying an IC design take into account HDL/HVL random variables and coverage areas (e.g., coverage points, cross points and/or coverage events), but they do not identify connections between the HDL/HVL random variables and the coverage areas. In other words, some systems do not identify which random variables influence outputs observed at coverage areas. A "connection" between a coverage area and a random variable means that a value of the random variable can influence an output observed at a coverage area. HDL/HVL code for a typical IC design can include upwards of millions of coverage points.

Some systems merely allow for a user to manually identify these connections between the random variables and the coverage areas. While the designer (user) will have some inherent knowledge about which random variables are connected to which coverage points, the designer will not have complete knowledge about every connection. Accordingly, manual identification of these connections this becomes time consuming when the random variables and coverage areas are not from the same class of variables and/or are separated in location and time in the HDL/HVL code.

Efficiently and accurately identifying the connections between the coverage areas in the IC design and the random variables in the HDL/HVL code can greatly improve the speed at which the IC is verified by fully testing and verifying each coverage area of the IC (e.g., can greatly improve the efficiency of coverage directed constraint solving for generating stimulus which can achieve coverage goals). Therefore, there is a need for a system that can identify connections between random variables of HDL/HVL code and coverage areas of an IC design and that can guide a solver to generate values for the random variables to target the coverage areas using a combination of multiple techniques.

Specifically, the techniques used to generate and/or infer (e.g., identify) the connectivity between the random variables and the coverage areas can include: (i) automatic static analysis at compile time to identify functional coverage areas (e.g., coverage points) connected to the random variables; (ii) automatic dynamic analysis at runtime using symbolic simulation and symbol propagation to connect random variables to coverage areas; (iii) automatic machine learning or statistical inference of relationships between the random variables and the coverage areas; and (iv) manual user guidance to specify user connection hints to supplement any of the above automatic techniques in order to direct the connectivity between the random variables and the coverage areas. Symbolic simulation is a form of simulation where many possible executions of an expression are considered simultaneously. This can be done heuristically. For example, and as to be understood by those skilled in the art, symbolic simulation can be used to simultaneously explore some or all aspects of an expression to determine which aspects of an expression, if any, influence (e.g., are connected to) a coverage area. Automatic can be defined as being performed without user interaction for performing an analysis and/or simulation.

The resulting connections between the random variables and coverage areas can be stored in one or more connectivity databases. These databases can be mined and used for various high value follow-on capabilities such as automated coverage convergence (e.g., closing coverage at a faster rate without human intervention), enhanced coverage analytics (e.g., generating some smart data an analytics and learning how tweaking random variables can affect coverage) and debug on the coverage, and root cause analysis (RCA) of coverage holes vis-a-vis the random variables (e.g., determining why some coverage areas are not being hit).

Using these techniques as part of an ensemble can increase the number of connections identified between the random variables in the HDL/HVL code and the coverage areas, since different design and testbench coding styles and architecture can result in different mileage for each independent technique in this ensemble of techniques. Together these techniques can (i) generate a much higher percentage of identified connections between random variables and coverage areas, as opposed to a user manually identifying the connections, and (ii) generate connections more efficiently, as opposed to using just a single technique on a range of design styles. Further, these techniques can enable scaling and generating of connections over and beyond simple cases where the coverage areas and random variables are obviously closely connected in location in the code.

SystemVerilog, standardized as IEEE 1800, is a hardware description and hardware verification language (HDHVL) used to model, design, simulate, test and implement electronic systems. As supported by SystemVerilog, functional coverage can check the overall or partial functionality of an integrated circuit (IC) design. To perform functional coverage, coverage areas (e.g., coverage points) are defined for the functions to be covered in the IC design. As used herein, a coverage point can also be referred to as a coverage event, a cover point, and a cover event. A coverage point can represent a physical point, such as a line of code being executed or a signal being toggled, or an expression being assigned a certain range of values on a clock.

As mentioned above, one aspect of the verification of the IC design is functional coverage, which identifies and counts the occurrences the various functions of various aspects of the IC being exercised in simulation. Functional coverage can be accomplished using constrained random test generation, which is the generation of "test" signals during simulation to test and verify the various functions of the IC.

Although functional coverage (e.g., making sure to hit or exercise all coverage areas in an IC design during a simulation) and constraint solving (e.g., constraining values of random variables connected to coverage areas during a simulation) are related, they can be defined separately in HDHVL code and may be implemented as two separate components in a functional verification system (e.g., Synopsys' VCS).

A constraint solver can be used to generate random tests by solving for values of random variables according to constraints. However, the distribution of generated random stimulus can be quite different from the distribution needed for higher coverage, which results in low efficiency of generating random tests to increase functional coverage.

A constraint solver can be used to generate replicated random tests, especially when approaching 100% or high coverage (e.g., 95% functional coverage). However, finishing the last 20% of functional coverage during verification of the IC design can take more than 80% of verification time. Constraints can be set to be too strict, such that some testing scenarios are not actually coverable. Constraints can also be set to be too loose, such that random tests do not cover meaningful testing scenarios in a reasonable amount of time. As a result, there is an inefficiency and redundancy in random input generation towards achieving the functional coverage goals, when the random input generation is unaware of the coverage connections. Thus, a need arises for an improved method for constraint solving to improve the efficiency of achieving complete functional coverage during IC design simulation.

Identifying Connections Between Random Variables and Connection Areas

FIG. 1 illustrates an example block diagram 100 of a connectivity engine 110. A connectivity engine 110 includes a compile time static connectivity analyzer 111 that performs a static analysis at simulation compile time. Compile time is a time at which the design and testbench is converted to machine instructions to form a program which can then be executed or simulated. The connectivity engine 110 can also include a runtime dynamic connectivity analyzer 112 that performs dynamic analysis at simulation runtime. Simulation runtime is a time at which the program is executed (e.g., a simulation of the IC design is being performed). The connectivity engine 110 can also include a machine learning engine 113, and a user guidance engine 114. The compile time static connectivity analyzer 111, the runtime dynamic connectivity analyzer 112, the machine learning engine 113 and the user guidance engine 114 can be implemented to generate and/or infer (e.g., identify) connectivity between (i) HDHVL constraints and random variables 101 of the HDHVL code, which may have pre-defined constraints, and (ii) coverage areas 102 of the IC design. As mentioned above, the random variables of the HDHVL may have pre-defined or user defined constraints, referred to as constrained values of the random variables. HDHVL constraints can be defined as equations which restrict or constrain the ranges and relationships between random variables. The random variables can represent input values for verifying the IC during simulation and can represent free variables which a solver can assign. Coverage areas can represent target event which are desired to be reached as a result of a series of simulations and can be various points of observation (with desired output values) of components of the IC. The operations of the compile time static connectivity analyzer 111, the runtime dynamic connectivity analyzer 112 and the machine learning engine 113 can be automatically implemented without user analysis or interaction.

The compile time static connectivity analyzer 111 can perform static analysis at compile time to identify connections between random variables and coverage areas including coverage points and events. This can be accomplished by the analyzer 111 scanning the HDHVL code to determine which variables could influence (e.g., be connected to) which coverage points. This scanning can be performed using various techniques, such as control flow analysis, connectivity traversal, etc. As used herein, "coverage point" can also be referring to a coverage area that includes coverage points, coverage events and cross points. This static analysis can result in connecting the random variables for typically between 20-100% of the coverage points of the overall coverage space of the IC design.

The runtime dynamic connectivity analyzer 112 can perform dynamic analysis at simulation runtime using symbolic simulation and symbol propagation to connect the random variables to coverage points. Symbolic simulation is a form of simulation where many possible executions of an expression are considered simultaneously. Dynamic analysis can be optimized by running only for simulation cycles for which unknown connectivity is established, as well as focusing on previously unidentified connectivity to coverage points which are already connected using the compile time static connectivity analyzer 111 or other techniques. This increases the efficiency and reduces the cost of the dynamic analysis performed by the runtime dynamic connectivity analyzer 112.

The machine learning engine 113 can perform machine learning or statistical inference of the relationship between the random variables and the coverage points. Machine learning can include statistical analysis on randomization and coverage traces obtained from the simulations (e.g., if a trace of values of random variables and coverage can be created, additional relationships can be derived using machine learning). Additionally, the machine learning can use decision trees, random forests or neural networks or a combination thereof to identify the most correlated variables using either correlation, information gain or other sensitivity measures. Depending on the IC design, some circuits can show strong relationships with very little effort and other circuits require sophisticated iterative techniques until the required accuracy and recall metrics of machine learning can be reached.

The user guidance engine 114 can receive connection hints from a user or design who may have inherent knowledge about connectivity between random variables and coverage points and who may have inherent knowledge about constraints to be applied to the random variables connected to the coverage points. This information gathered from the user can be used to establish (identify) the connections between the random variables and the coverage points and to establish constraints on the values used for the random variables during simulation of the IC design. For example, user connection hints can be provided in the form of a comma-separated values (CSV) or JavaScript Object Notation (JSON) input file. The user connection hints can be provided from the user in other forms as well, such as a graphical user interface.

Figure 2:
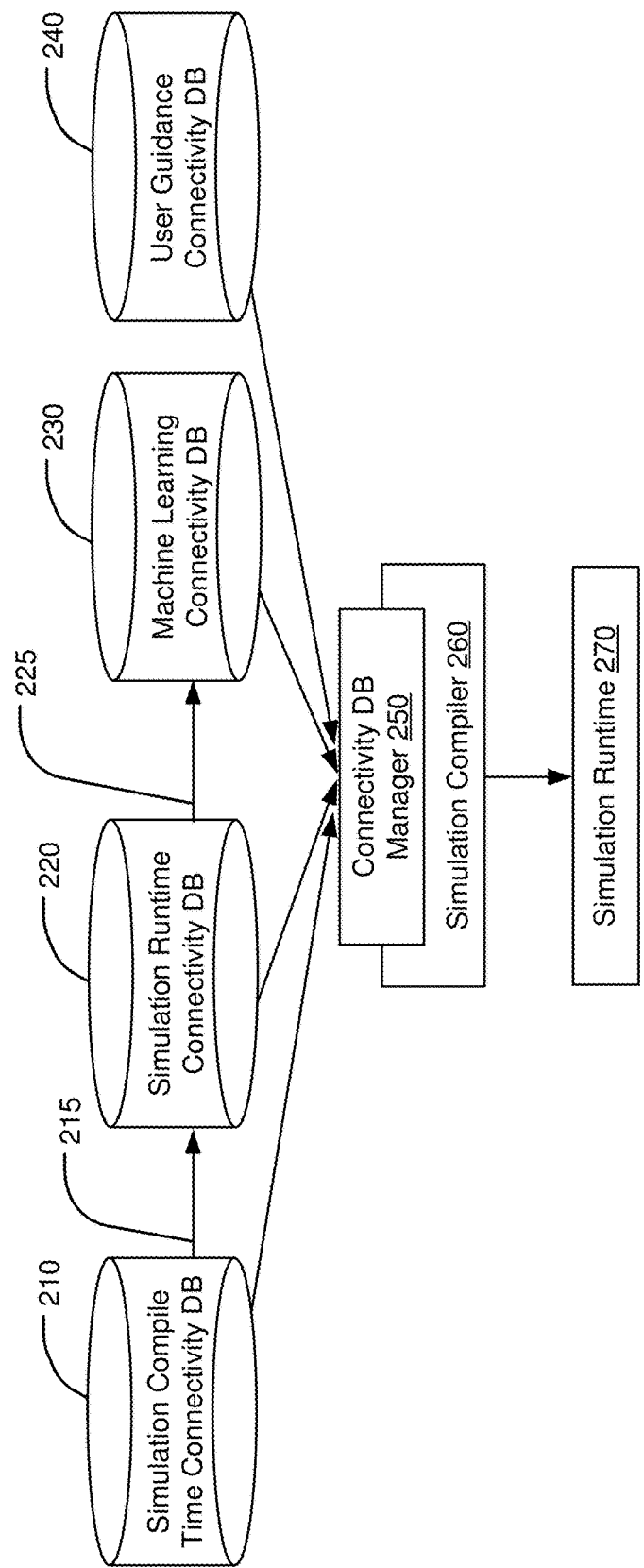
FIG. 2 illustrates a flow for identifying connections between random variables and coverage points and storing the identified connections in various connectivity databases in accordance with some embodiments.

FIG. 2 illustrates a flow 200 for identifying connections between random variables and coverage points and storing the identified connections in various connectivity databases. As mentioned above, the connections can be identified using several different techniques working in conjunction with one another, such as those implemented by the compile time static connectivity analyzer 111, the runtime dynamic connectivity analyzer 112, the machine learning engine 113 and the user guidance engine 114, as illustrated in FIG. 1. The connections identified by the compile time static connectivity analyzer 111 can be stored in a simulation compile time connectivity DB 210, the connections identified by the runtime dynamic connectivity analyzer 112 can be stored in a simulation runtime connectivity DB 220, the connections identified by the machine learning engine 113 can be stored in a machine learning connectivity DB 230, and the connections identified by the user guidance engine 114 can be stored in a user guidance connectivity DB 240.

A connectivity database (DB) manager 250 can manages or merge the connections identified using the compile time static connectivity analyzer 111, the runtime dynamic connectivity analyzer 112, the machine learning engine 113 and the user guidance engine 114 and respectively store the connections and related information in the simulation compile time connectivity DB 210, the simulation runtime connectivity DB 220, the machine learning connectivity DB 230 and the user guidance connectivity DB 240. the connectivity DB manager 250 can also provide the identified connections to a simulation compiler 260. Compiled HDHVL code, including the identified connections between the random variables and the coverage points can be used at simulation runtime 270.

Information 215 from the simulation compile time connectivity DB 210 can be passed to the simulation runtime connectivity DB220 or to the runtime dynamic connectivity analyzer 112. In other words, the information 215 regarding the connections identified by the compile time static connectivity analyzer 111 can be passed to the runtime dynamic connectivity analyzer 112 for further identification of connections. This information 215 can identify the connections that have already been identified by the compile time static connectivity analyzer 111, so that the runtime dynamic connectivity analyzer 112 does not waste time targeting those connections which have already been identified by the compile time static connectivity analyzer 111.

Similarly, information 225 from the simulation runtime connectivity DB220 can be passed to the machine learning connectivity DB230 or the machine learning engine 113. In other words, the information 225 regarding the connections identified by the runtime dynamic connectivity analyzer 112 can be passed to the machine learning engine 113 for further identification of connections. This information 225 can include simulation traces (e.g., a dump or repository of values of random variables and coverage points) for machine learning training. The information 225 can also identify which connections have already been identified by the compile time static connectivity analyzer 111 and the runtime dynamic connectivity analyzer 112, so that the machine learning engine 113 can focus on those connections which have not already been identified. Although FIG. 2 illustrates the use of multiple connectivity database, a single connectivity database can be implemented to store the connection information.

Figure 3:
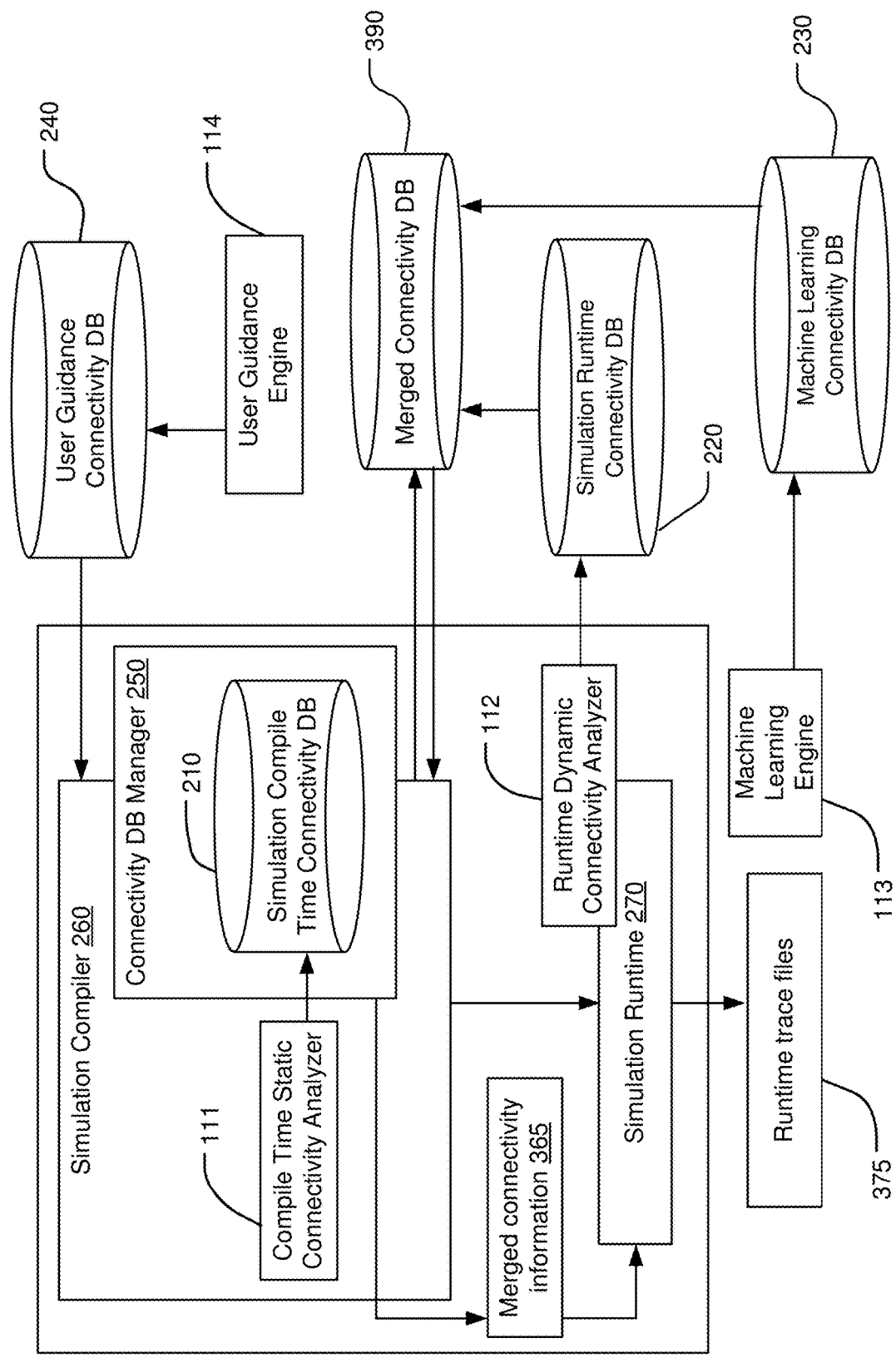
FIG. 3 illustrates an example of generating a merged connectivity database in accordance with some embodiments.

FIG. 3 illustrates an example 300 of generating a merged connectivity database (DB).

As illustrated, the compile time static connectivity analyzer 111 can be implemented at simulation compile time by the simulation compiler 260 to identify the connections between the random variables and the coverage points so that the connectivity DB manager 250 can store the connections in the simulation compile time connectivity DB 210. The runtime dynamic connectivity analyzer 112 can be implemented at simulation runtime 270 to identify additional connections between the random variables and the coverage points so that the connections can be stored in the simulation runtime connectivity DB 220 by, for example, the connectivity DB manager 250. The machine learning engine 113 can be implemented to identify additional connections between the random variables and the coverage points so that the connections can be stored in the machine learning connectivity DB 230 by, for example, the connectivity DB manager 250. The user guidance engine 114 can be implemented to obtain connections (or hints about connections) between random variables (and constraints) and coverage points so that the obtained connections (or hints about connections) can be stored in the user guidance connectivity DB 240 by, for example, the connectivity DB manager 250. The connections (or hints about connections) stored in the user guidance connectivity DB 240 can be used by the simulation compiler 260 to influence the compile time static connectivity analyzer 111, the runtime dynamic connectivity analyzer and/or the machine learning engine 113 (e.g., add to automatically inferred connectivity). Further, the connectivity manager 250 can merge together the connections identified by the compile time static connectivity analyzer 111, the runtime dynamic connectivity analyzer 112, the machine learning engine 113, and the user guidance engine 114 into a merged connectivity database 390. The connectivity DB manager 250 can also apply merged connectivity information 365, as obtained from the merged connectivity DB 390 (or the simulation compile time connectivity DB 210, the simulation runtime connectivity DB 220 and/or the machine learning connectivity DB 230), to be implemented at simulation runtime 270. As simulations run over time, the merged connectivity DB 390 retains a repository of connectivity data of all coverage points connections identified over multiple simulations). Simulation runtime 270 can generate runtime trace files 375 including information such as random variables and coverage points.

1. Example Static Analysis at Compile Time

Static analysis at compile time (e.g., the compile time static connectivity analyzer 111) can result in the identification of connections between random variables and 20-100% of coverage points of the overall coverage space of an IC. Static traversal of the compiled code (for simulation of the IC) can identify a connection between a random variable and a coverage point unless a coverage point is hit. This static traversal can also leverage common patterns of access to test bench variables in coverage models, such as, but not limited to:
a. references to constrained classes or objects in the coverage model;
b. identifying which of those references have random variables associated with them;
c. traversal through HDHVL functions to increase the scope of the search for connected random variables; and
d. leverage the identification of standard patterns for test bench architecture such as coverage analysis ports or channels used to connect the coverage model to the constrained random variables.

These connections identify coverage points and the connected random variables and can also identify a functional relationship between the random variables and the coverage points. These connections can also identify cross points and the connected random variables. As used herein, a cross point refers to a combination of multiple coverage points.

Static connections can be made at compile time during to compilation phase of simulation, or runtime during a testbench 'build' phase, and are relatively inexpensive to compute since they are done in the early stage of an IC verification.

These connections identified by the compile time static connectivity analyzer 111 are identified as static connections and stored in the simulation compile time connectivity DB 210.

FIG. 4A illustrates an example of simplified SystemVerilog code 400 that is analyzed at compile time to identify connections between random variables and coverage points. Specifically, FIG. 4A illustrates random variables "rand reg [31:0] addr1" and "rand reg [31:0] addr2" and a coverage group "covg". The coverage group "covg" includes a connection from a coverage point "CP1" to the random variable "rand reg [31:0] addr1". The compile time static connectivity analyzer 111 can analyze this SystemVerilog code 400 to identify the connections between the coverage point "CP1" and the random variables "rand reg [31:0] addr1" and "rand reg [31:0] addr2". This identified connection can be saved in the simulation compile time connectivity DB 210.

FIG. 4B illustrates another example of simplified SystemVerilog code 402 that is analyzed at compile time to identify connections between random variables and coverage points. Specifically, in the example shown in FIG. 4B, the coverage group "covg" includes a connection from a coverage point "CP1" to a random variable "reg [31:0] addr1", but the random variable "reg [31:0] addr1" is from a function "sample" and has no binding to the integrated circuit (IC) design (e.g., "reg [31:0] addr1" is not associated with a class "data_bus" associated with an IC design). However, the random variable "reg [31:0] addr1" is instantiated with the function "sample", in order to have a binding to the IC design. This identified connection can be saved in the simulation compile time connectivity DB 210.

FIG. 4C illustrates another example of simplified SystemVerilog code 404 that is analyzed at compile time to identify connections between random variables and coverage points. Specifically, FIG. 4C illustrates random variables "rand reg [31:0] addr1" in a class "data_bus", "rand reg [31:0] mem1" in a class "data_mem", and a coverage group "covg". The coverage group "covg" includes a first connection (e.g., "connection 1") from a first coverage point "CP1" to the random variable "b.addr1" of the class "data_bus", and a second connection (e.g., "connection 2") from a second coverage point "CP2" to the second random variable "m.mem1" of the class "data_mem". These identified connections can be saved in the simulation compile time connectivity DB 210.

In general, HDHVL code (e.g., SystemVerilog code) for an IC design can have multiple coverage groups and multiple random variables throughout. The present system and method can identify the connections, from the multiple random variables to the multiple coverage points in multiple coverage groups, by analyzing the HDHVL code. These identified connections can be saved in various databases (e.g., the simulation compile time connectivity DB 210, the simulation runtime connectivity DB 220, the machine learning connectivity DB 230, the user guidance connectivity DB 240 and the merged connectivity DB 390), depending on the stage of the simulation of the IC.

2. Example Dynamic Analysis at RunTime

Dynamic connection identification performed by the runtime dynamic connectivity analyzer 112 can use symbolic simulation propagation at runtime using the HDHVL random variables until the random variables reach the coverage points of interest, and can result in identifying connections and equations for the functional relationship between the random variables and the coverage points identified at runtime. The symbolic simulation may have various optimizations such as the number of cycles for which symbolic simulation is run, the variables on which symbols are propagated, etc., in order to increase the capacity and effectiveness of dynamic connection identification using symbolic simulation. This dynamic connection identification is used to supplement the connections identified at compile time.

Dynamic analysis can establish (i) connections between coverage groups and HDHVL random variables, (ii) expression connections between coverage groups and the HDHVL random variables, and (iii) procedural connections between coverage groups and HDHVL random variables. The connections established by dynamic analysis can be identified (e.g., marked or flagged) as dynamic connections and stored in the simulation runtime connectivity DB 220.

FIG. 5 illustrates an example connectivity report 500 from the static analysis. In this example, the report can include a sample summary report and a cross summary report and can also identify connected random variables, and connected crosses (e.g., cross points). As used herein, a cross (or cross point) refers to a combination of multiple coverage points. As illustrated, the "sample summary report" identifies the number of coverage points (e.g., 2), the number of static connections (e.g., 2), the number of dynamic (e.g., conndb) connections (e.g., 0) and a connection percentage (e.g., 100% of coverage is connected). Further, the sample summary report can identify a bin count (e.g., 19) of the connected coverage points (e.g., in one type of coverage in HDHVL code is called functional covergroups, where a coverage point variable is characterized by bines, which is a value of ranged of interest, where there can be multiple bins of a coverage point), the number of static connections (e.g., 19) for a coverage bin, the number of dynamic (e.g., conndb) connections (e.g., 0) and a connection percentage (e.g., 100%).

Further, the "cross summary report" can identify a cross (e.g., cr) count (e.g., 1), which is the number of connected cross points, a number of connected coverage points (e.g., cps) (e.g., 1), a connection percentage (e.g., 100%), a bin count (e.g., 48) of the connected cross point, the number of connected bins (e.g., 48) of the connected cross point, and a connection percentage (i.e., 100%). The example connectivity report 500 can also identify (i) names and locations of coverage groups, (ii) names and locations of coverage points, (iii) names and locations of connected random variables and (iv) names and locations of connected cross points.

FIG. 6A illustrates example simulation runtime connectivity code 600 regarding dynamic connections in accordance with some embodiments. This example simulation runtime connectivity code (or information) 600 can be stored in the simulation runtime connectivity DB 220 and identifies a coverage group, a random variable and a specific coverage point.

FIG. 6B illustrates example results of dynamic analysis. In this example, connectivity information 602 from dynamic analysis can include a coverage group "uart_agent_pkg.uart_agent_cov.uart_cg" that includes a connection from a random variable "en_parity" to a coverage point "cp_en_parity". This example connectivity information 600 is identified from the example simulation runtime connectivity code regarding dynamic connections, as illustrated in FIG. 6A. These results can be stored in a database at runtime and can be used by the system during a next compile time or during a subsequent runtime.

3. Examples of Machine Learning

Machine learning techniques can utilize information gain, entropy, correlation and other statistically valid techniques to link a subset of the random variables to coverage points. These techniques can also infer ranges and expressions of interest on the random variables to either hit the coverage points (e.g., exercise the coverage points to obtain the desired outcomes) or miss the coverage points (e.g., observe the coverage points with undesirable outcomes). Coverage event hit information and miss information a can both be used in the context of automated coverage closure. Coverage event hit information allows the guidance and bias in the direction of unhit or rarely hit coverage points. Coverage event miss information allows the guidance and bias away from the direction of already or frequently hit coverage points.

Machine learning techniques can use data in the form of constraint variable and coverage bin traces to identify the connectivity to infer connectivity using the aforesaid techniques. Machine learning techniques are more data-intensive and expensive computationally and can be used to supplement the statically and dynamically generated connections.

FIG. 7 illustrates example results 700 from machine learning. Machine learning can produce connections between coverage groups and relevant random variables, and expressions and ranges between coverage groups and identified random variables. As an example, FIG. 7 illustrates a coverage group "INCR16_BURST", a random variable "data_[4]", an expression "test.ahbFlCoverage.coverageData.burst_type" (e.g., this can represent a connected random variable represented hierarchically based on its position. this example indicates that the connected variable is test.ahbFlcoverage.coverageData.burst_type is the connected variable), and inferred ranges "this.data_[4] dist {[0:4275682944]:=96, [946986720:4275682944]:=4, [0:946986720]:=1, [1016127424:4275682944]:=1}" for the expression (e.g., this can represent the likely distribution of the connected random variable required to target the coverage point, where the range can be, for example, from 0 to 4,275,682,944, etc. and the value 96, 4, 1 can represent the relative weights).

4. Examples of Manual User Guidance

Manual user guidance (e.g., use of the user guidance engine 114) in the form of a syntax or user interface can be used to connect existing coverage groups to random variables and the expressions and ranges of interest of the random variables. This user guidance can be used to supplement the connections identified by the compile time static connectivity analyzer 111 and the runtime dynamic connectivity analyzer 112 with manually entered user domain knowledge.

FIG. 8 illustrates example information 800 that includes user connection hints. For example, user connection hints can be provided in the form of a comma-separated values (CSV) or JavaScript Object Notation (JSON) input file. The input file can be converted into a desired format and saved in the user guidance connectivity DB 240. The user guidance can be obtained from an application, such as a graphical user interface, that converts user selections to the input file. FIG. 8 includes four example connections C1, C2, C3 and C4. Connection C1 includes a SystemVerilog (SV) reference 'Cg1.s1', where 'Cg1' refers to a coverage group 1 and 's1' refers to a coverage point within the coverage group 1. Connection C1 is identified as a "sample" type and includes a random variable Class1.var1[5:0] which can refer to a signal having 6 bits within an integrated circuit design. A "sample" type can represent a single coverage event which may be comprised of bins, where a cross point can be a cross product of two or more sample events. Connection C1 specifies that the random variable Class1.var1[5:0] is connected to the coverage point/event 'Cg1.s1'. Additional connectivity information can be included (e.g., sv_function_name(1), which can represent a transfer function defined in the HDHVL code)

Connection C2 includes an SV reference 'Cg1.s2', where 'Cg1' refers to coverage group 1 and 's2' refers to a coverage point within the coverage group 1. Connection C2 includes random variables Class1.var1[3:0] and Class1.var2[1:0]. Connection C2 is identified as a "sample" type and specifies that the random variables Class1.var1[3:0] and Class1.var2[1:0] are connected to the coverage point/event 'Cg1.s2'. Additional connectivity information, such as "{$1, $2}//concat" can be included.

Connection C3 includes an SV reference 'Cg1.s3', where 'Cg1' refers to coverage group 1 and 's3' refers to a coverage point within the coverage group 1. Connection C3 is identified as a "sample" type and includes random variables Class2.var1 and Class1.var2. Connection C3 specifies that the random variables Class2.var1 and Class1.var2 are connected to the coverage point/event 'Cg1.s3'. Additional connectivity information, such as "$1+$2//addition" can be included.

Connection C4 includes an SV reference 'Cg1.c1', where 'Cg1' refers to a coverage group 1 and 'c1' refers to a coverage point within the coverage group 1. Connection C4 is identifies as a "cross" (e.g., cross point) and includes random variables C1, C2 and C3. Connection C4 specifies that the random variables C1, C2 and C3 are connected to the coverage point/event 'Cg1.c1'.

Example Connectivity Database

As described above, the simulation compile time connectivity DB 210 can store connections (e.g., static connections) identified at compile time, the simulation runtime connectivity DB 220 can store connections (e.g., dynamic connections) identified at runtime, the machine learning connectivity DB 230 can store connections identified by machine learning and the user guidance connectivity DB 240 can store connections identified by a user. The information stored in these above-mentioned databases can be merged into the merged connectivity DB 390 or collectively referred to as a connectivity database (e.g., a ConnectDB database).

The connectivity database can include both: (i) the related random variables and coverage points; and (ii) the functional relationships between the random variables and the coverage points in the form of expressions, functions or ranges of interest for hitting or missing the coverage points.

Constraining Values of the Random Variables During Simulation of an Integrated Circuit The embodiments described herein can achieve faster coverage closure of various test scenarios (e.g., coverage areas) for verification of the IC design including a plurality of values or range of values of a plurality of test variables (e.g., the random variables of the HDHVL code, as discussed above with respect to FIGS. 1-8) by coverage directed constraint solving (e.g., solving of constrained values of random variables connected to coverage points of the IC design). Closure of a coverage area can be achieved when the coverage area and the random variables connected thereto are sufficiently tested and verified. The embodiments described in the present disclosure may be implemented as a feature of a simulator and targeted on a hardware description language (HDL) and/or a hardware verification language (HVL), such as for example, System Verilog, but nevertheless this framework and these techniques are applicable to all verification methodology relying on constrained test generation and using coverage points.

In some embodiments, in the simulator for verifying the IC design, a coverage and a constraint solver may be two separate components. By way of a non-limiting example, there may be no connection between the coverage component and the constraint solver. An approach disclosed herein may bridge the gap between the coverage component and constraint solver by utilizing (i) compile and runtime static instrumentation that is based on connection information obtained from the merged connectivity DB 390 of FIG. 3 that connects random variables to coverage points and (ii) runtime dynamic mapping between random variables and coverage points.

As discussed above, the system can generate the merged connectivity DB 390 that identifies connections between variables (e.g., random variables) and coverage points. The merged connectivity DB 390 can be used to associate the coverage points for simulation. Each coverage point can further include a set of bins associated with the values of the connected variables or expressions Accordingly, the constraint solver may be able to get coverage information such as the definitions of user defined coverage points and cross points and the hit status of their bins, i.e., the number of times each coverage point and cross point are executed to reach a desired or expected value.

In some embodiments, a constraint solver may be split into a problem generation component and a core solver component. In some embodiments, a solving method of a core solver may be integrated into a framework of the constraint solver. The solving method may be directed by coverage and targets on coverage points and cross points. By way of a non-limiting example, maintaining hit counts of the bins of the coverage points and cross points may reduce or eliminate random value replication. Further, correlated coverage points and cross points may be put together into the same partition, and thereby improving the problem generation.

In some embodiments, to extend the coverage closure across simulations, the simulator may load a database for storing coverage data, such as covered bins and uncovered bins of coverage points and cross points. By way of a non-limiting example, the coverage data stored in the database may be from previous simulations. After loading the database, a simulation may attempt to prioritize uncovered bins so that coverage can increase faster. Accordingly, the simulation method as described herein may boost coverage closure.

Figure 9:
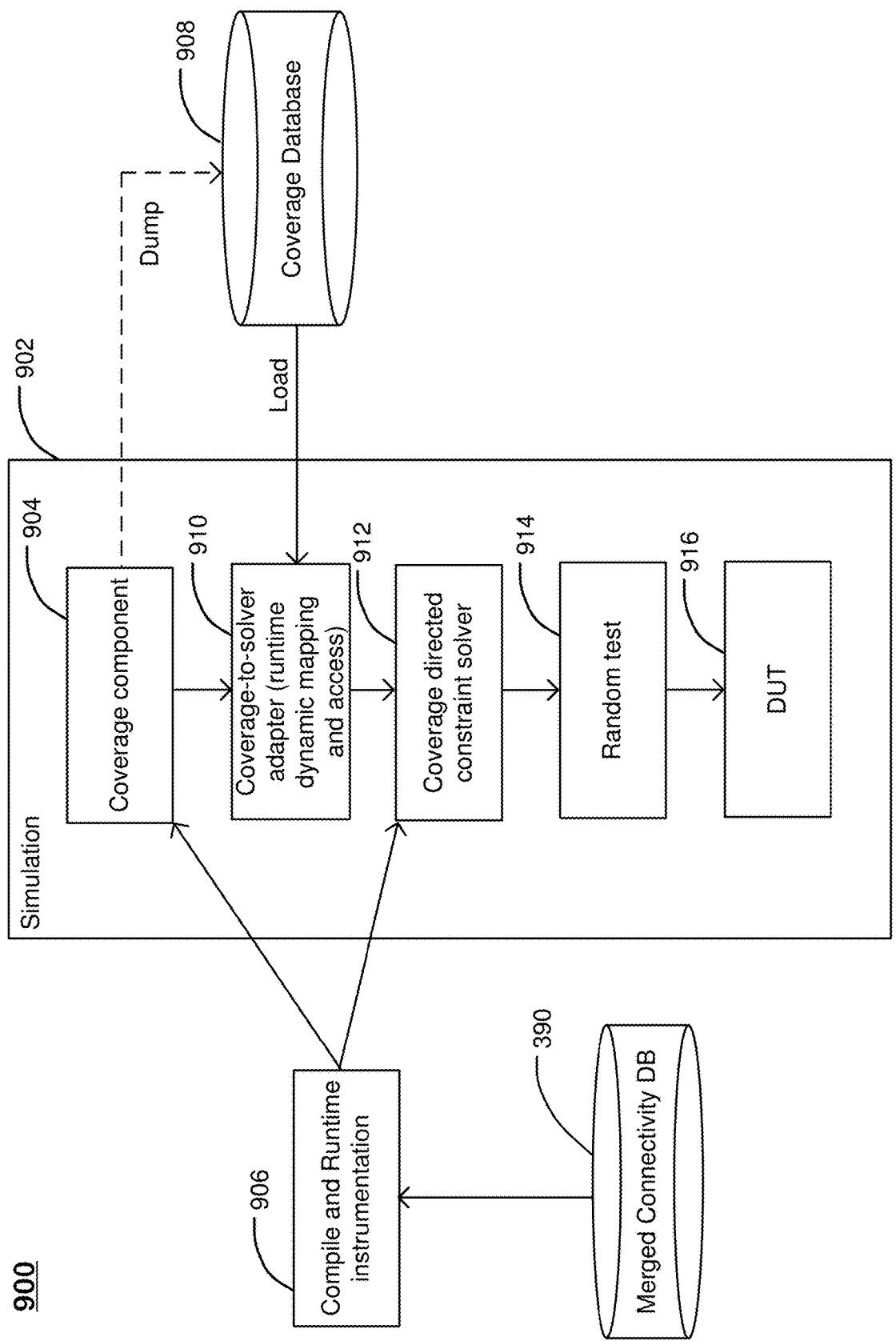
FIG. 9 illustrates an architecture for constraining values of the random variables during simulation of an integrated circuit accordance with some embodiments.

FIG. 9 describes an architecture 900 for constraining values of the random variables during simulation of an integrated circuit in accordance with some embodiments. As illustrated in FIG. 9, a simulation 902 of an IC requires a coverage component 904 that identifies coverage points and counts the number of hits to the coverage points, and stored and persisted in a coverage database 908, wherein the connection between coverage points to the random variables are applied to the simulation executable using compile and runtime instrumentation 906. Specifically, the coverage component 904 can be a part of the simulator responsible for obtaining and tracking the hit counts to the user specified coverage points. The actual counts of the hits along with the information about the shapes and location of the coverage points can be stored and persisted in the coverage database 908. The instrumentation 906 can be responsible for adding the coverage connection information to the random variables either at compile time or run-time. The architecture 900 can include a coverage-to-solver adapter 910 for reading coverage values, such as hits, to various coverage events from the coverage database 908 and can be for providing the solver component 912 access to the number of hits to each bin of the identified coverage points. The simulation 902 also requires the use of a coverage directed constraint solver 912 and the implementation of a random test 914 on the device under test (DUT) 916, which can be the simulated IC. The compile and runtime instrumentation can 906 can identify a coverage component 904 (e.g., a coverage point and/or a cross point) of a coverage group and can identify connections between random variables and the coverage component 904. The coverage component 904 can include multiple coverage points. This compile and runtime instrumentation 906 can provide the connectivity information regarding the coverage components by accessing the merged connectivity DB 390.

The coverage-to-solver adapter 910 can load information from a coverage database 908 to identify a count of a number of hits bins of coverage points identified by the coverage component 904. A number of hits is a number of times a bin of a coverage point has been exercised to reach a desired value of the coverage point. The compile and runtime instrumentation 906 and the runtime dynamic mapping of the coverage points to the hit counts, attributes and initialization parameters, as performed by the coverage-to-solver adapter 910 may be a prerequisite to make it possible for the coverage directed constraint solver 912 to constrain the random variables. Based on coverage information (e.g., information regarding connections between the coverage points and/or cross points and the random variables) obtained by the compile and runtime instrumentation 906 and the mapping of the coverage points to the information identifying the number of hits, the attributes and the initialization parameters, as performed by the coverage-to-solver adapter 910, the coverage directed constraint solver 912 may achieve coverage closure (i.e., simulation and verification of all coverage points and cross points) faster. By way of a non-limiting example, the coverage database 908 may be updated after each simulation 902. The coverage component 904 can dump information into the coverage database 908 regarding which coverage points have been simulated. This creates historical information for each simulation 902 that can be later used by the coverage-to-solver adapter during the same or subsequent simulations or other simultaneous simulations. For example, for SystemVerilog based architecture, the coverage database 908 may be a Verilog Database (VDB). By loading a VDB from previous simulations, the coverage closure not only within each single simulation but also across multiple simulations may be achieved. Each step of these constraint coverage techniques is described in detail below.

1. Instrumentation and Mapping:

In accordance with some embodiments, the coverage directed constraint solver 912 may interact with the coverage component 904 by accessing coverage information (e.g., connectivity information with respect to coverage points and/or cross points and random variables) obtained by the compile and runtime instrumentation 906 and the coverage-to-solver adapter 910. Using the connections between the random variables and the coverage components (e.g., coverage points) generated or identified at compile time and using the connections between the random variables and the coverage components generated or identified at runtime, the coverage directed constraint solver 912 can identify objects and variables connected with the coverage points and the cross points.

1.1 Compile and Runtime Instrumentation (Compile and Runtime Instrumentation 906):

FIGS. 10A and 10B illustrated generated compile-time instrumentation code in accordance with some embodiments. Specifically, FIG. 10A illustrates example code 1000, and FIG. 10B illustrates example code 1002.

The compile and runtime instrumentation is described as following steps.

Step 1: Find target classes where coverage point and/or cross point variables (e.g., variables connected to coverage points and/or cross points) are likely to be randomized.

In some embodiments, coverage points and/or cross points can be connected to random variables at compile time using the techniques described above with reference to FIGS. 1-8. Further, in some embodiments, at compile time, coverage point variables may be analyzed to find out a common prefix. The class of the prefix is where the variables are likely to be randomized. By way of a non-limiting example, following are few examples:

cp1: coverpoint a.b.c.x;
The common prefix is a.b.c, so the target class is the class of c.
cp2: coverpoint a.b.c.y+a.b.z;
The common prefix is a.b, so the target class is the class of b.
cr1: cross cp1, cp2;
The common prefix is also a.b, so the target class is the class of b.

Step 2: Instrument coverage points and cross points to target classes

In some embodiments, before coverage points and cross points may be instrumented (e.g., targeted) to their target classes, unique IDs and variable lists (e.g., a list of variables associated with coverage points or cross points) for each of the coverage points and cross points may be required. The IDs and variable lists of the coverage points and cross points may be added to target classes as part of class definitions.

Step 3: Instrument callback functions for getting target object handles to coverage groups. Instrument can be a term used to denote the addition of code into the original user's code to perform a specific function. Here, the function involves addition of so-called 'callback functions', which basically means—if this code is executed, it 'calls back' other registered pieces of code to the callback.

In accordance with some embodiments, an example of a callback function for the above coverage point cp2 may be as shown below:

function class_of_b get_target_object_handle;
 return a.b;
endfunction

The above-specified callback function may be called at runtime to get a target object handle.

1.2 Runtime Mapping (Coverage-to-Solver Adapter 910):

In accordance with some embodiments, by way of a non-limiting example, steps of the runtime mapping performed by the coverage-to-solver adapter 910 may be as described below.

Step 1: Collect Instances of Coverage Points and Cross Points

In accordance with some embodiments, at runtime, a plurality of instances of coverage points and cross points may be created and initialized. While creating and initializing the plurality of instances of coverage points and cross points, the plurality of instances of coverage points and cross points may be added to a global table, for example, named Covg_Inst_Table where the key is a pair <ID, Object_handle>, where Object_handle is obtained by calling the callback function as described above.

Step 2: Collect Instances of Coverage Points and Cross Points Associated with Randomization In accord with some embodiments, randomization may be required to collect relevant objects. The relevant objects may include a root object on which the randomization is performed and the sub objects, which are the members of the root object or other sub objects. Inside each of these objects, there could be coverage point IDs and/or cross point IDs instrumented. Accordingly, a look up in the table Covg_Inst_Table by the IDs and the handles of the objects, corresponding coverage point and/or cross point instances may be obtained. The coverage point and/or cross point instances obtained as described herein from the table Covg_Inst_Table and based on the obtained coverage point and/or cross point instances, the mapping between the coverage point and/or cross point instances and the randomizations may be created.

Step 3: Get Details of Coverage Points and Cross Points

In accordance with some embodiments, details of the plurality of coverage points and cross points may be obtained by the coverage-to-solver adapter 910 accessing the coverage database 908. By way of a non-limiting example, the details may include definitions and hit counts of bins, attributes, and initialized parameters, etc. The coverage directed constraint solver 912 may conduct constraint solving directed using the information obtained by the coverage-to-solver adapter 910.

2. Coverage Directed Solving (Coverage Directed Constraint Solver 912):

In accordance with some embodiments, the connectivity information obtained by the compile and runtime instrumentation 906 and mapping information generated by the coverage-to-solver adapter 910 to identify which bins of the coverage points have been hit more and which bins of the coverage points have been hit less can be provided to the coverage directed constraint solver 912. The coverage directed constraint solver 912 can target the related coverage points and cross points (e.g., guide the solution of constraints to help hit some coverage target) by generating random values for uncovered (unhit) bins or less covered (hit) bins. By way of a non-limiting example, the coverage directed constraint solver 912 can eliminate or reduce the redundancy of random values of variables and accelerate the coverage closure. The following are examples of the features of the coverage directed constraint solver 912, as described herein.

2.1 Probability Distributions:

In some embodiments, two types of distributions of variable constraints can be implemented, including covergroup inferred probability distribution and constraint defined probability distribution.

1. Covergroup Inferred Probability Distribution:

Covergroup inferred probability distribution is the distribution inferred from bins of coverage points and cross points defined in a covergroup. In this distribution, each bin has an equal probability with other bins corresponding to the same coverage point or cross point and each value of a bin has an equal probability with other values of the bin. Users may define covergroups according to their intended distribution so that they can know the completeness of verification and the richness of random tests by monitoring the functional coverage on these covergroups.

2. Constraint Defined Probability Distribution,

Constraint defined probability distribution specifies constraints that may define the distribution of the solution space of all random variables presented in a constrained problem. By way of a non-limiting example, the distribution may be joint uniform distribution as a default option. Two kinds of constraints may change the distribution, which are distribution constraints and solve-before constraints. Distribution constraints can specify certain distributions of values to a variable, such as [range1:range2], etc. Solve-before constraints can specify a solving order (e.g., solve variable1 before variable2, etc.).

Figure 11:
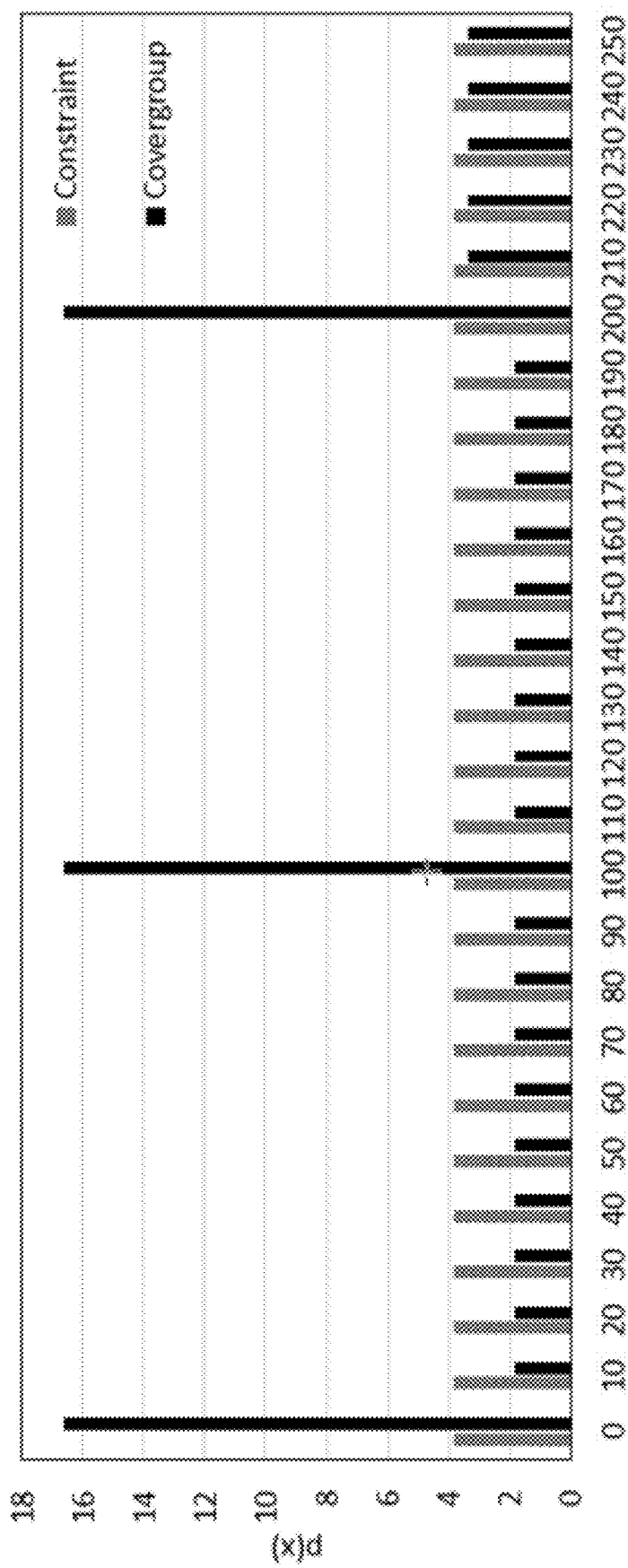
FIG. 11 illustrates a probability distribution chart in accordance with some embodiments.

In accordance with some embodiments, by way of a non-limiting example, the following code snippet may include both a constraint and a covergroup. The two distributions 1100 are shown in FIG. 11. Specifically, FIG. 11 illustrates the covergroup inferred probability distribution and the constraint defined probability distribution. In the following example, the constraint defined probability distribution defines a uniform distribution for variable x, and the covergroup defined probability distribution defines a non-uniform distribution, where the values within [0:9], [100:109] and [200:209] are given more possibilities than other values.

```
rand bit[7:0] a, b;
constraint cnst {
   a!=b;
}
cp1:coverpoint a {
   bins b0={[0:9]};
   bins b1={[10:99]};
   bins b2={[100:109]};
   bins b3={[110:199]};
   bins b4={[200:209]};
   bins b5={[210:255]};
}
```

In some embodiments, the coverage directed constraint solver 912 may need to use covergroup inferred distribution to boost coverage closure and satisfy constraints.

2.2 Adjusting Probability Function

In some embodiments, the coverage directed constraint solver 912 may generate random values according to a coverage probability distribution. Accordingly, a value of x in probability function p(x) of covergroup may be inferred from the bins of the coverage point instead of p(x) of constraint defined by constraints so that in the above example, the values within [0:9], [100:109] and [200:209] may get more chance to be picked. This may be desirable when the bins b0, b2 and b4 of coverage point cp1 have been hit fewer times than the other bins. As a result, the generated test 914 will be biased to constrain the variables so that bins b0, b2 and b4 will have an increased chance of being hit.

In some embodiments, to eliminate or reduce replication and accelerate coverage closure, hit counts of each bin may be recorded in, for example the coverage database 908, and the probability function may be adjusted according to hit counts.

$$b = \frac{c}{p \sum c_i},$$

where b denotes bias factor, c denotes hit count, p denotes probability of a bin.

$$p' = \frac{p}{b},$$

where p' is biased probability.

$$p'' = \frac{p'}{\sum p_i'},$$

where p" is normalized probability.

In some embodiments, the probability function may be updated to p"(x) that may use following bias factor for increasing or reducing the impact of hit count on probability by choosing w. "w" can be a weight assigned internally by the coverage directed solver constraint solver 912 based on feedback from the coverage-to-solver adapter 910 (e.g., if bin is already hit numerous times as determined by the coverage-to-solver adapter 910, then the weight "w" can be reduced.

$$b = \left(\frac{c}{p \sum c_i}\right)^w$$

2.3 Multiple Coverage Points and Cross Points in Randomization

In some embodiments, randomization may contain multiple coverage points and cross points and some of them may be defined on the same variables. Scores may be calculated for each of them so that the coverage points and the cross points with higher scores may get higher priorities to be handled during solving. The scores may be updated for each randomization. By way of a non-limiting example, the score may be calculated based on the following considerations: (i) percentage of bins which are already covered, less percentage is given a higher score; (ii) total count of bins, less count is given a higher score; (iii) type of coverage points and/or cross points, e.g. user-defined or auto-generated coverage points, a user-defined coverage point can be given a higher score; and (iv) a cross point can be initially given a higher score than a coverage point.

2.4 Success Criteria for Coverage Points and Cross Points:

In some embodiments, a coverage point or a cross point may be specified to be hit for a preconfigured number of times, for example, using an option named at_least in the definition of the coverage point and/or cross point. A bin may, therefore, be treated as uncovered until it is hit for a value specified using the at_least option. When the bins corresponding to the coverage points and cross points have been hit for more than the value specified using the at_least option, the coverage points and cross points may be deemed successful. Successful coverage points and cross points may be allowed to stop the above handling in the rest of simulation.

Figure 12:
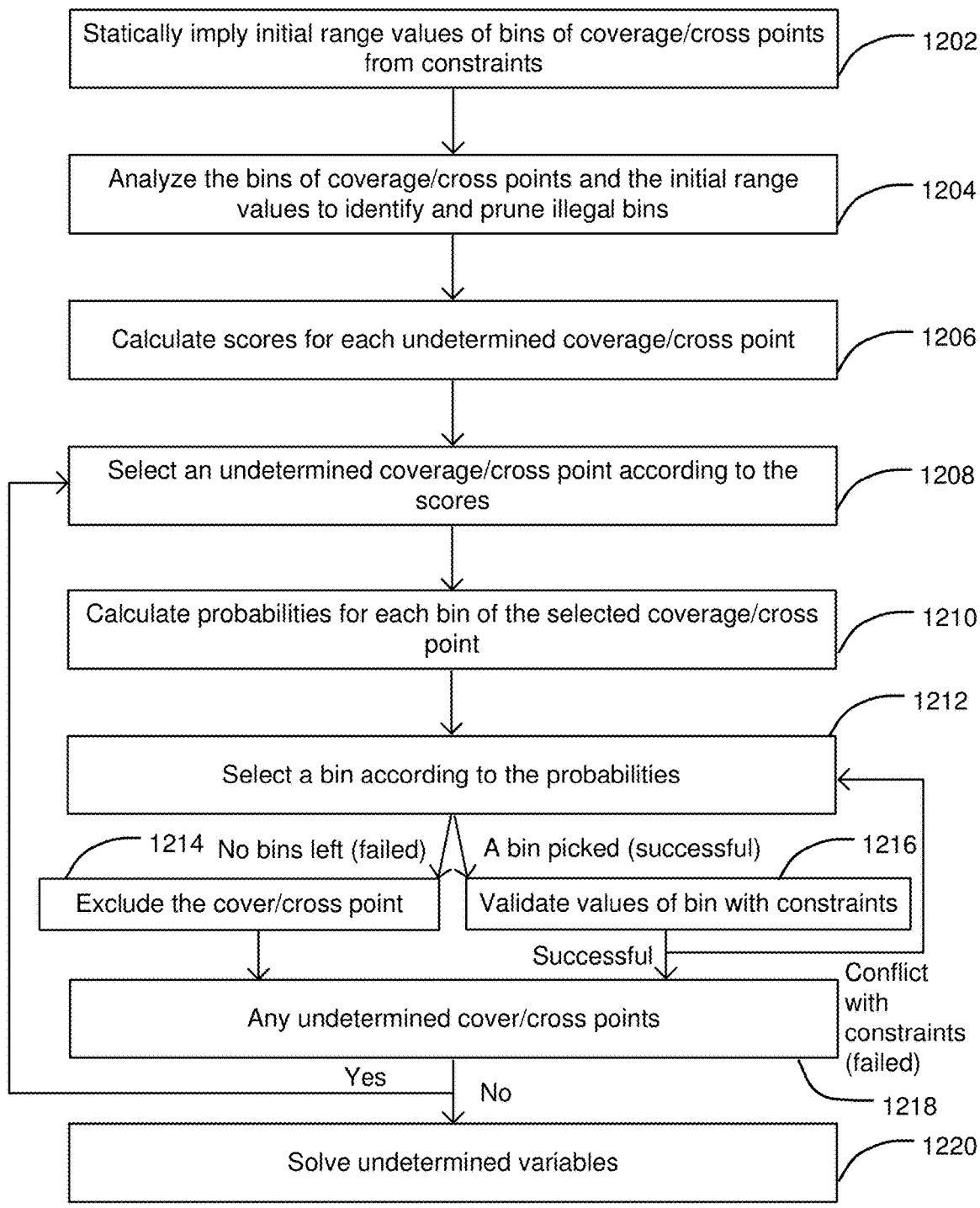
FIG. 12 illustrates a flowchart of a coverage directed solving method in accordance with some embodiments.

2.5 Coverage Directed Solving Method:

In some embodiments, the coverage directed constraint solver 912 can perform the operations 1200 illustrated in FIG. 12. As shown in FIG. 12, at operation 1202 a complete list of possible value ranges of the test (random) variables which are required to hit bins of coverage/cross points are identified, given the constraints seen in the current problem being solved.

At operation 1204, the bins of coverage/cross points are analyzed to determine illegal bins. Each coverage/cross point includes one or more bins, as described in this disclosure above. A bin is illegal if all values of the bin don't satisfy the constraints associated with the test variable. An example, a test variable x has three bins, including bins [1:10], [11:20] and [21:30], and a constraint related to x is x≥11. As a result, bin [1:10] is not satisfied by the constraint and cannot be covered. Accordingly, the bin including values [1:10] for the variable x is an illegal bin. As the initial values or the range of initial values are implied from constraints, they already exclude all or part of unsatisfied values of test variables. In some embodiments, illegal bins can be excluded by intersecting the values of bins with the initially determined list of possible values. The bins which fall outside the intersection represent bins which are not hittable for this invocation of the problem. These are pruned from the current list of possible bins. If a bin remains unhittable for all the problems solved during the course of multiple simulations, it is deemed illegal for the aggregate set of simulations and highlighted as such.

At operation 1206, a score for each undetermined coverage/cross point can be calculated. An undetermined coverage/cross point is a coverage/cross point for which the value has yet not been determined. The score may be calculated according to the description in section 2.3 from above.

At operation 1208, an undetermined coverage/cross point may be selected according to its score.

At operation 1210, a probability score for each bin of the picked coverage/cross point may be calculated according to the described formula in section 2.2 from above. Based on the calculated probability score at operation 1210, a bin may be selected for testing based on the probability score in operation 1212. After the selection of the bin to be tested, the values of the selected bin are validated with constraints at operation 1216 by (re)confirming that the selected value does not violate any user-specified constraint. If there are no bins left to select in operation 1212, then, at operation 1214, the bin selection fails and the coverage/cross point is excluded from the list of undetermined coverage/cross points. If the validation is not successful (e.g., there is a conflict with a constraint, such that the constraint cannot be satisfied with the value picked, for example, if a value of 4 was picked for random variable a, but there is a user constraint that "a>x" where "x" happens to be set to 5, then the user constraint is violated), then operation 1212 is performed again. If the validation is successful, then operation determines whether there are any other remaining undetermined coverage/cross points in operation 1218. If there are still remaining undetermined coverage/cross points, then operation 1208 is implemented to select another undetermined coverage/cross point. If there are no undetermined coverage/cross points remaining at operation 1218, then operation 1220 can be utilized to implement common solving algorithms to determine the values of random variables connected to the undetermined coverage/cross points.

3. Coverage Closure Across Randomizations:

In some embodiments, by way of a non-limiting example, the VDB may be the coverage database 908 on a disk for storing coverage data, e.g., all coverage points and cross points initialized during simulation, and the hit counts of all the bins of the coverage points and cross points. By loading the VDB from previous simulations, the coverage closure may be extended from "within a single simulation" to "across multiple simulations." Unified Coverage API (UCAPI) may provide a uniform interface to access the VDB. UCAPI may be called for getting previous data, for example, hit counts and fed into the coverage directed constraint solver 912.

4. Example Results

FIG. 13 is an example of a test written using an HDL, such as, for example, System Verilog. As shown in FIG. 13, in the test 1300 there may be two coverage points (e.g., cp1 and cp2), each having 21 bins and one cross point (e.g., cr1, which is a cross of cp1 and cp2) with 441 bins (e.g., 21 bins of cp1 multiplied by 21 bins of cp2). In this example test, in one run, the randomization may be repeated 20 times. For example, this test can involve randomization of the test or random variables contained in instance 'obi' of class cls in a loop repeating 20 times (repeat (20)). Each invocation of the obj.randomize( ) call effectively sets random variables of the class variable 'obi' of the type 'cls', which in turn contains the random variables x and y, with the constraint cb {x!=y}.

Figure 14:
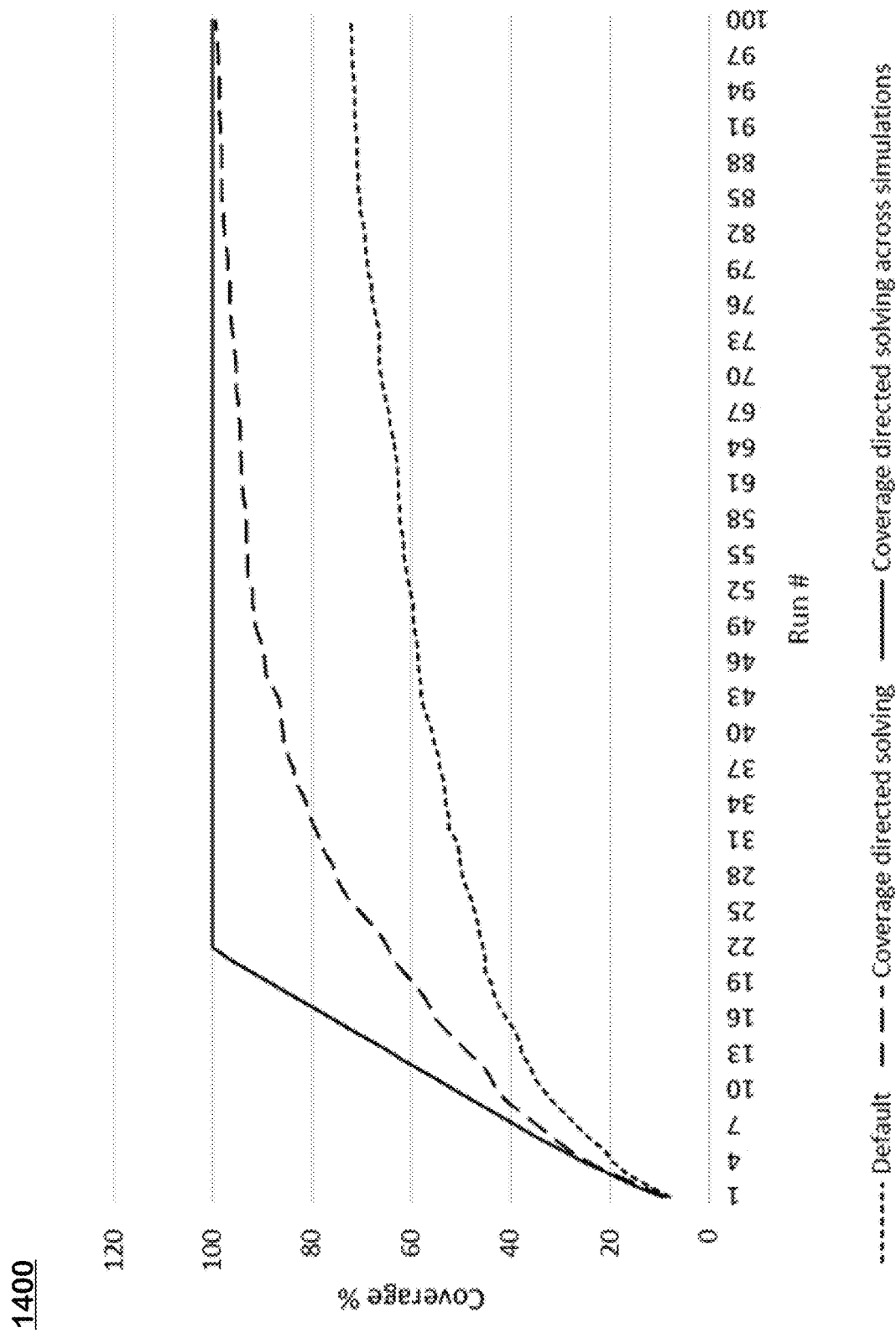
FIG. 14 illustrates a graph showing results of the functional coverage based on embodiments of the present disclosure

FIG. 14 illustrates example test results 1400 in accordance with some embodiments, where a test executed by default is compared to tests executed using the coverage directed solving and the coverage directed solving across multiple simulations, as explained herein. As shown in FIG. 14, the coverage directed solving across multiple simulations reaches 100% coverage significantly sooner (i.e., fewer test runs) than the default. Specifically, by default, the simulation reached 72.26% coverage after 100 runs. With the coverage directed solving method, the simulation reached 99.46% coverage after 100 runs and with loading of the VDB (i.e., directed solving across multiple simulations), the simulation reached 100% coverage at the $22^{nd}$ run.

Figure 15:
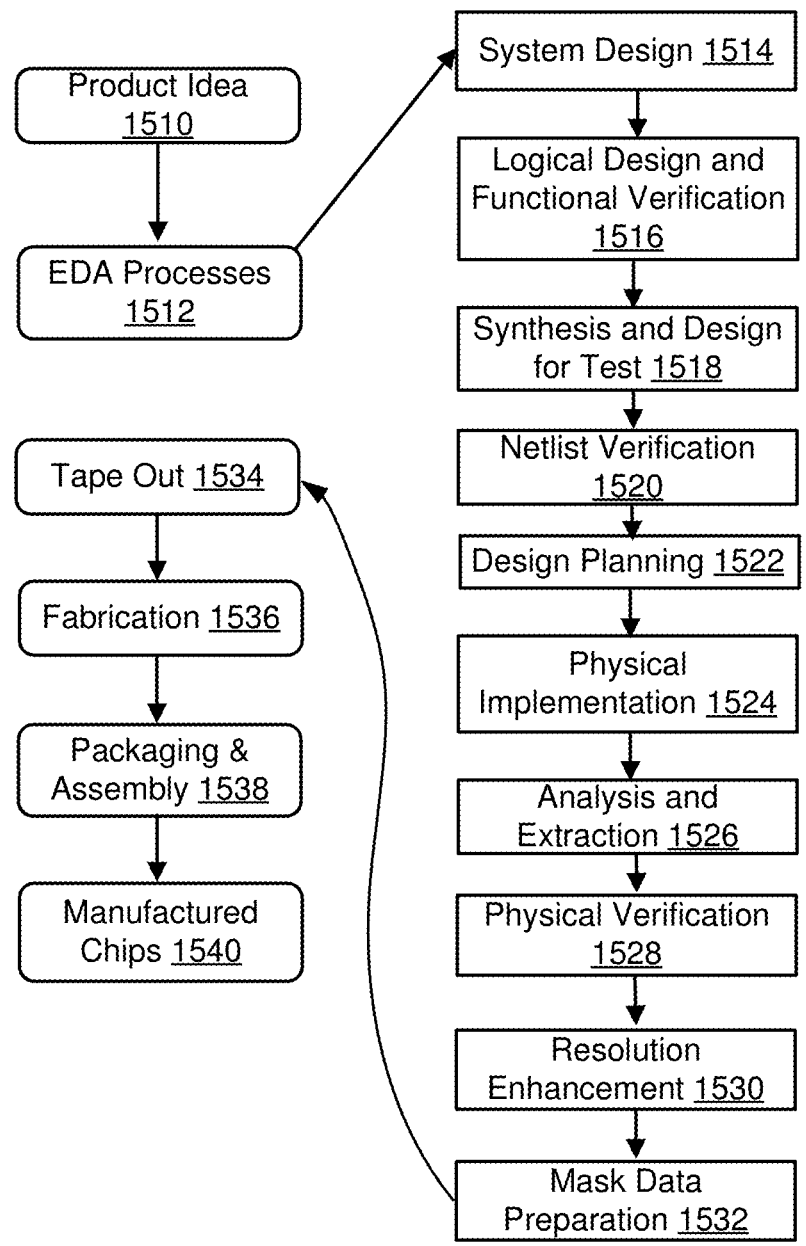
FIG. 15 depicts a flowchart of various processes used during the design and manufacture of an integrated circuit in accordance with some embodiments of the present disclosure.

FIG. 15 illustrates an example set of processes 1500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1510 with information supplied by a designer, information which is transformed to create an article of manufacture that uses a set of EDA processes 1512. When the design is finalized, the design is taped-out 1534, which is when artwork (e.g., geometric patterns) for the integrated circuit is sent to a fabrication facility to manufacture the mask set, which is then used to manufacture the integrated circuit. After tape-out, a semiconductor die is fabricated 1536 and packaging and assembly processes 1538 are performed to produce the finished integrated circuit 1540.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a less detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 15. The processes described by be enabled by EDA products (or tools).

During system design 1514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification. This functional verification 1516 can implement the techniques described herein with reference to FIGS. 1-14.

During synthesis and design for test 1518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1520, the netlist is checked for compliance with timing constraints and for correspondence with the HDL code. During design planning 1522, an overall floor plan for the integrated circuit is constructed and analyzed for timing and top-level routing.

During layout or physical implementation 1524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1526, the circuit function is verified at the layout level, which permits refinement of the layout design. During physical verification 1528, the layout design is checked to ensure that manufacturing constraints are correct, such as DRC constraints, electrical constraints, lithographic constraints, and that circuitry function matches the HDL design specification. During resolution enhancement 1530, the geometry of the layout is transformed to improve how the circuit design is manufactured.

During tape-out, data is created to be used (after lithographic enhancements are applied if appropriate) for production of lithography masks. During mask data preparation 1532, the 'tape-out' data is used to produce lithography masks that are used to produce finished integrated circuits.

A storage subsystem of a computer system (such as computer system 1600 of FIG. 16) may be used to store the programs and data structures that are used by some or all of the EDA products described herein, and products used for development of cells for the library and for physical and logical design that use the library.

Figure 16:
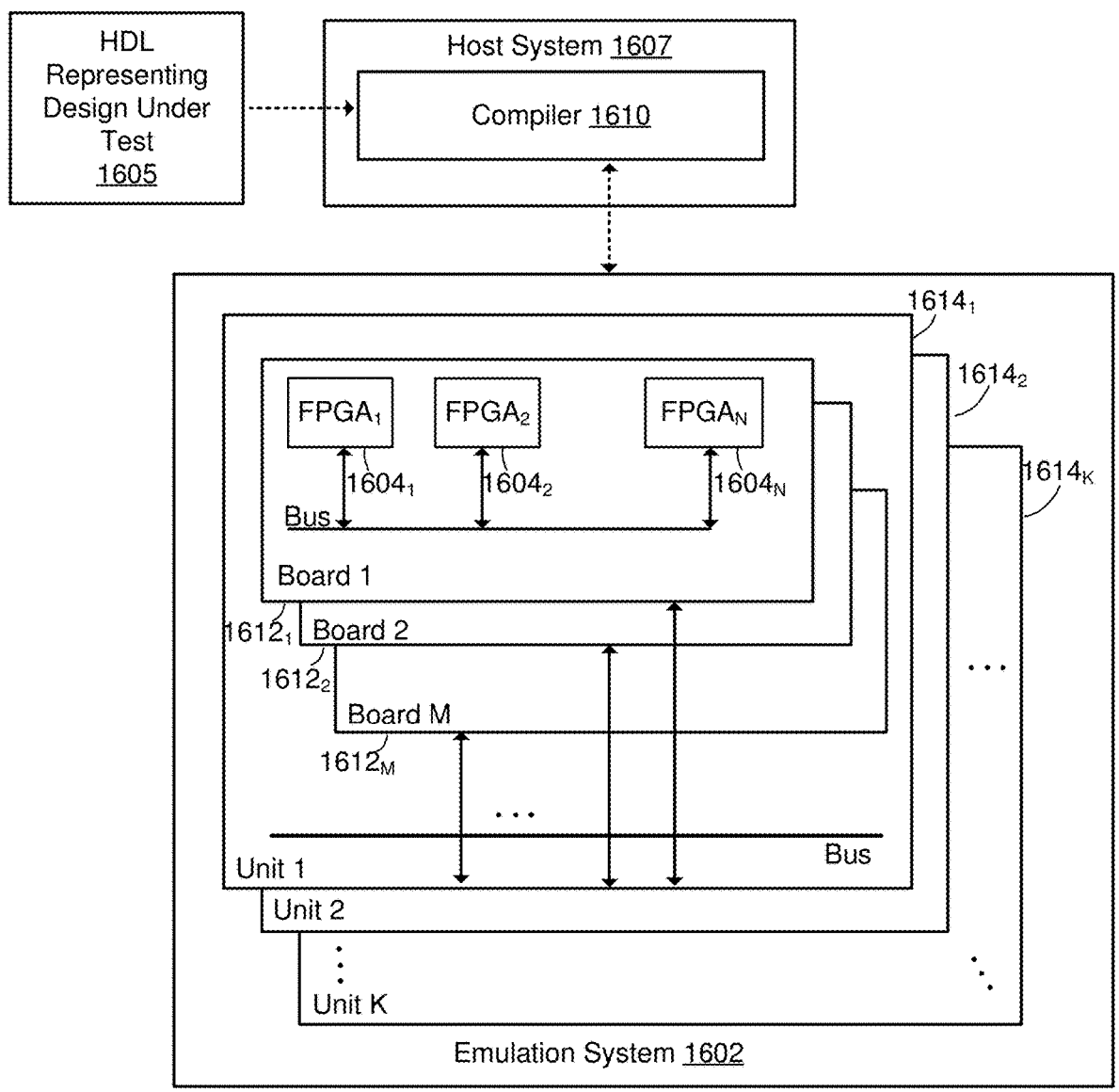
FIG. 16 depicts a diagram of an example emulation system in accordance with some embodiments of the present disclosure.

FIG. 16 depicts a diagram of an example emulation environment 1600. An emulation environment 1600 may be configured to verify the functionality of the circuit design. The emulation environment 1600 may include a host system 1607 (e.g., a computer that is part of an EDA system) and an emulation system 1602 (e.g., a set of programmable devices such as Field Programmable Gate Arrays (FPGAs) or processors). The host system generates data and information by using a compiler 1610 to structure the emulation system to emulate a circuit design. A circuit design to be emulated is also referred to as a Design Under Test ('DUT') where data and information from the emulation are used to verify the functionality of the DUT.

The host system 1607 may include one or more processors. In the embodiment where the host system includes multiple processors, the functions described herein as being performed by the host system can be distributed among the multiple processors. The host system 1607 may include a compiler 1610 to transform specifications written in a description language that represents a DUT and to produce data (e.g., binary data) and information that is used to structure the emulation system 1602 to emulate the DUT. The compiler 1610 can transform, change, restructure, add new functions to, and/or control the timing of the DUT.

The host system 1607 and emulation system 1602 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 1607 and emulation system 1602 can exchange data and information through a third device such as a network server.

The emulation system 1602 includes multiple FPGAs (or other modules) such as FPGAs 1604₁ and 1604₂ as well as additional FPGAs to 1604_N. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1602 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs 1604₁-1604_N may be placed onto one or more boards 1612₁ and 1612₂ as well as additional boards through 1612_M. Multiple boards can be placed into an emulation unit 1614₁. The boards within an emulation unit can be connected using the backplane of the emulation unit or any other types of connections. In addition, multiple emulation units (e.g., 1614₁ and 1614₂ through 1614_K) can be connected to each other by cables or any other means to form a multi-emulation unit system.

For a DUT that is to be emulated, the host system 1607 transmits one or more bit files to the emulation system 1602. The bit files may specify a description of the DUT and may further specify partitions of the DUT created by the host system 1607 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1607 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1607 and/or the compiler 1610 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1605 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 17:
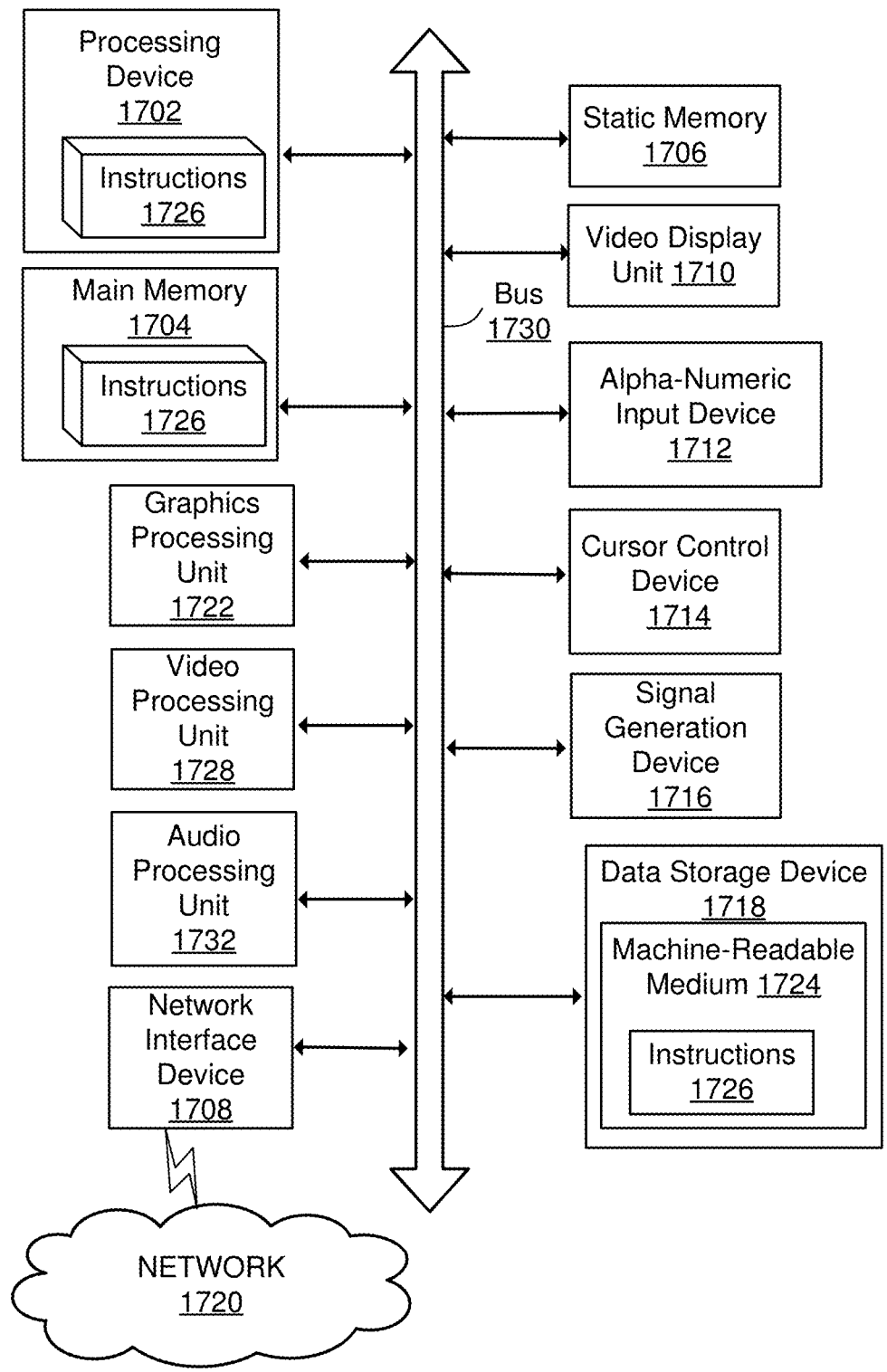
FIG. 17 depicts a diagram of an example computer system in which embodiments of the present disclosure may operate.

FIG. 17 illustrates an example machine of a computer system 1700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1700 includes a processing device 1702, a main memory 1704 (e.g., read-only memory (ROM), flash memory, dynamic random access memory (DRAM) such as synchronous DRAM (SDRAM), a static memory 1706 (e.g., flash memory, static random access memory (SRAM), etc.), and a data storage device 1718, which communicate with each other via a bus 1730.

Processing device 1702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1702 may also be one or more special-purpose processing devices such as an application specific integrated circuit (ASIC), a field programmable gate array (FPGA), a digital signal processor (DSP), network processor, or the like. The processing device 1702 may be configured to execute instructions 1726 for performing the operations and steps described herein.

The computer system 1700 may further include a network interface device 1708 to communicate over the network 1720. The computer system 1700 also may include a video display unit 1710 (e.g., a liquid crystal display (LCD) or a cathode ray tube (CRT)), an alphanumeric input device 1712 (e.g., a keyboard), a cursor control device 1714 (e.g., a mouse), a graphics processing unit 1722, a signal generation device 1716 (e.g., a speaker), graphics processing unit 1722, video processing unit 1728, and audio processing unit 1732.

The data storage device 1718 may include a machine-readable storage medium 1724 (also known as a non-transitory computer-readable medium) on which is stored one or more sets of instructions 1726 or software embodying any one or more of the methodologies or functions described herein. The instructions 1726 may also reside, completely or at least partially, within the main memory 1704 and/or within the processing device 1702 during execution thereof by the computer system 1700, the main memory 1704 and the processing device 1702 also constituting machine-readable storage media.

In some implementations, the instructions 1726 include instructions to implement functionality corresponding to the present disclosure. While the machine-readable storage medium 1724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for verifying an integrated circuit (IC) design described in a hardware description or hardware verification language (HDHVL), the method comprising:
    identifying connections between random variables and coverage areas of the IC design, as described in HDHVL code, the connections being identified by determining which coverage areas of the IC design will be influenced during simulation by which random variables, such that each connection identifies, at least, (i) a respective random variable and (ii) a coverage area of the IC design that will be influenced by the respective random variable during simulation;
    storing the identified connections in a database; and
    using, by a processor connections retrieved from the database to simulate and verify the coverage areas of the IC design.

2. The method of claim 1, wherein the identifying of the connections includes performing a static analysis of the HDHVL code at compile time, prior to runtime simulation, to identify, from the identified connections, static connections between at least a portion of the random variables and at least a portion of the coverage areas of the IC design.

3. The method of claim 1, wherein the identifying of the connections includes performing a dynamic analysis of the HDHVL code at runtime simulation to identify from the identified connections, dynamic connections between at least a portion of the random variables and at least a portion of the coverage areas of the IC design using symbolic simulation.

4. The method of claim 1, wherein the identifying of the connections includes performing machine learning to identify, from the identified connections, connections between at least a portion of the random variables and at least a portion of coverage areas of the IC design.

5. The method of claim 1, wherein the identifying of the connections includes receiving user guidance via a user interface or data provided by the user to identify, from the identified connections, connections between at least a portion of the random variables and at least a portion of the coverage areas of the IC design.

6. The method of claim 1, wherein the identifying of the connections includes at least two of:
    performing a static analysis of the HDHVL code at compile time, prior to runtime simulation, to identify, from the identified connections, static connections between at least a portion of the random variables and at least a portion of the coverage areas of the IC design;
    performing a dynamic analysis of the HDHVL code at runtime simulation to identify, from the identified connections, dynamic connections between at least a portion of the random variables and at least a portion of the coverage areas of the IC design using symbolic simulation;
    performing machine learning to identify, from the identified connections, connections between at least a portion of the random variables and at least a portion of coverage areas of the IC design; and
    receiving user guidance via a user interface or data provided by the user to identify, from the identified connections, connections between at least a portion of the random variables and at least a portion of the coverage areas of the IC design.

7. The method of claim 1, wherein the identifying of the connections includes at least three of:
    performing a static analysis of the HDHVL code at compile time, prior to runtime simulation, to identify, from the identified connections, static connections between at least a portion of the random variables and at least a portion of the coverage areas of the IC design;
    performing a dynamic analysis of the HDHVL code at runtime simulation to identify, from the identified connections, dynamic connections between at least a portion of the random variables and at least a portion of the coverage areas of the IC design using symbolic simulation;
    performing machine learning to identify, from the identified connections, connections between at least a portion of the random variables and at least a portion of coverage areas of the IC design; and
    receiving user guidance via a user interface or data provided by the user to identify, from the identified connections, connections between at least a portion of the random variables and at least a portion of the coverage areas of the IC design.

8. The method of claim 1, wherein the identifying of the connections includes each of:
    performing a static analysis of the HDHVL code at compile time, prior to runtime simulation, to identify, from the identified connections, static connections between at least a portion of the random variables and at least a portion of the coverage areas of the IC design;
    performing a dynamic analysis of the HDHVL code at runtime simulation to identify, from the identified connections, dynamic connections between at least a portion of the random variables and at least a portion of the coverage areas of the IC design using symbolic simulation;
    performing machine learning to identify, from the identified connections, connections between at least a portion of the random variables and at least a portion of coverage areas of the IC design; and
receiving user guidance via a user interface or data provided by the user to identify, from the identified connections, connections between at least a portion of the random variables and at least a portion of the coverage areas of the IC design.

9. The method of claim 1, wherein the coverage areas include cross points and the identifying of connections identifies, from the identified connections, connections between at least a portion of the random variables and the cross points.

10. The method of claim 1, wherein the coverage areas include coverage points and the identifying of connections identifies, from the identified connections, connections between at least a portion of the random variables and the coverage points.

11. The method of claim 10, further comprising:
obtaining coverage information regarding the coverage points for which the connections to the random variables have been identified, each coverage point of the coverage points including a plurality of bins, the coverage information including a status of the plurality of bins corresponding to each coverage point,
wherein the simulating and verifying of the IC design includes:
for a particular coverage point identified as being connected to a random variable, selecting a bin of the plurality of bins of the particular coverage point in dependence on the status of the plurality of bins of each coverage point; and
simulating the IC design to continue closure of the particular coverage point by performing constrained randomization of the random variable connected to the selected bin of the particular coverage point.

12. The method of claim 11, wherein the status indicates a number of times each bin of the plurality of bins has been hit to achieve a desired value of a corresponding coverage point.

13. The method of claim 12, wherein the selecting selects the bin in dependence on the status of the plurality of bins of each coverage point, such that the selected bin is hit to achieve a desired value less than a determined number of times.

14. The method of claim 13, wherein the simulating and verifying of the IC design includes loading a coverage database comprising coverage history data from previous simulations, wherein the closure of the particular coverage point is continued in dependence on the coverage history data from the loaded coverage database.

15. The method of claim 14, wherein the constrained randomization of the random variable connected to the selected bin of the particular coverage point is performed in dependence on the coverage history data from the loaded coverage database.

16. A method for verifying an integrated circuit (IC) design described in a hardware description or hardware verification language (HDHVL), the method comprising:
using identified connections between random variables and coverage points of the IC design to simulate and verify the coverage points of the IC design, wherein each connection identifies, at least, (i) a respective random variable and (ii) a coverage area of the IC design that will be influenced by the respective random variable during simulation; and
obtaining, by a processor, coverage information regarding the coverage points for which the connections to the random variables have been identified, each coverage point of the coverage points including a plurality of bins, the coverage information including a status of the plurality of bins corresponding to each coverage point,
wherein the simulating and verifying of the coverage points of the IC design includes:
for a particular coverage point identified as being connected to a random variable, selecting a bin of the plurality of bins of the particular coverage point in dependence on the status of the plurality of bins of each coverage point; and
simulating the IC design to continue closure of the particular coverage point by performing constrained randomization of the random variable connected to the selected bin of the particular coverage point.

17. The method of claim 16, wherein the status indicates a number of times each bin of the plurality of bins has been hit to achieve a desired value of a corresponding coverage point.

18. The method of claim 17, wherein the selecting selects the bin in dependence on the status of the plurality of bins of each coverage point, such that the selected bin is hit to achieve a desired value less than a determined number of times.

19. The method of claim 18, wherein the simulating and verifying of the IC design includes loading a coverage database comprising coverage history data from previous simulations, wherein the closure of the particular coverage point is continued in dependence on the coverage history data from the loaded coverage database.

20. A system comprising:
a memory storing instructions for verifying an integrated circuit (IC) design described in a hardware description or hardware verification language (HDHVL); and
a processor, coupled with the memory and configured to execute the instructions, the instructions when executed cause the processor to perform operations comprising:
identifying connections between random variables and coverage areas of the IC design, as described in HDHVL code, such that each connection identifies, at least, (i) a respective random variable and (ii) a coverage area of the IC design that will be influenced by the respective random variable during simulation;
storing the identified connections in a database; and
using connections retrieved from the database to simulate and verify the coverage areas of the IC design.

* * * * *